US006683645B1

(12) United States Patent
Collins et al.

(10) Patent No.: US 6,683,645 B1
(45) Date of Patent: Jan. 27, 2004

(54) IMAGING SYSTEM WITH LOW SENSITIVITY TO VARIATION IN SCENE ILLUMINATION

(75) Inventors: Stephen Collins, Malvern (GB); Gillian F Marshall, Malvern (GB); Michael F Wade, Fleet (GB)

(73) Assignee: QinetiQ Limited, London (GB)

( * ) Notice: Subject to any disclaimer, the term of this patent is extended or adjusted under 35 U.S.C. 154(b) by 0 days.

(21) Appl. No.: 09/068,887

(22) PCT Filed: Dec. 1, 1995

(86) PCT No.: PCT/GB95/02808

§ 371 (c)(1),
(2), (4) Date: May 22, 1998

(87) PCT Pub. No.: WO97/21304

PCT Pub. Date: Jun. 12, 1997

(51) Int. Cl.[7] .............................................. H04N 5/335
(52) U.S. Cl. ...................................... 348/294; 348/252
(58) Field of Search ................... 348/294, 252, 348/241, 288, 300, 302, 307, 308, 312, 625, 627, 342; 382/266, 312, 199; 250/208.1; 257/369, 290; 327/551, 563

(56) References Cited

U.S. PATENT DOCUMENTS

| 4,667,239 A | * | 5/1987 | Dudley et al. ............... 348/627 |
| 4,719,350 A | | 1/1988 | Alm |
| 4,780,762 A | | 10/1988 | Nagasaki |
| 4,973,833 A | | 11/1990 | Takada et al. |
| 5,153,731 A | | 10/1992 | Nagasaki et al. |
| 5,343,254 A | * | 8/1994 | Wada et al. ................. 348/627 |
| 5,557,234 A | * | 9/1996 | Collins ......................... 327/563 |
| 5,808,676 A | | 9/1998 | Biegelsen et al. |
| 5,977,535 A | * | 11/1999 | Rostoker .................. 250/208.1 |
| 6,014,685 A | * | 1/2000 | Marshall et al. ............ 708/801 |
| 6,058,223 A | * | 5/2000 | Strohbehn .................... 382/312 |
| 6,212,289 B1 | * | 4/2001 | Sarpeshkar et al. .......... 382/199 |

FOREIGN PATENT DOCUMENTS

EP        0 626 784        11/1994

OTHER PUBLICATIONS

Proceedings of the IEE/RSJ International Conference on Intelligent Robots and Systems, Raleigh, NC., Jul. 7–10, 1992, vol. 1, Jul. 7, 1992, Institute of Electrical and Electronics Engineers, pp. 367–372, XP000339029 Parent F et al: A VLSI Implementation of a Light Sensor With Imbedded Focal Plane Processing Capabilities: see p. 367, right-hand column, line 23–line 32.
IEE Colloquium on 'Integrated Imaging Sensors and Processing', Dec. 5, 1994, London, UK, pp. 1–6, XP000575379 S. Collins et al.: "A Critical Review of analogue image processing" cited in the application.

* cited by examiner

*Primary Examiner*—Aung Moe
(74) *Attorney, Agent, or Firm*—Nixon & Vanderhye P.C.

(57) ABSTRACT

An imaging system comprises an image detection unit (52) and a filter unit (58). Pixel image signals are passed in parallel from the image detection unit (52) to the filter unit (58). Circuit elements within each pixel (56) generate pixel image signal whose amplitude is proportional to the logarithm of the image intensity at that pixel. The filter unit (58) carries out a spatial filtering operation and outputs the result.

40 Claims, 15 Drawing Sheets

IMAGING SYSTEM WITH LOW SENSITIVITY TO VARIATION IN SCENE ILLUMINATION

BACKGROUND OF THE INVENTION

This application is the US national phase of International Application No. PCT/GB95/02808, filed Dec. 1, 1995, the entire content of which is hereby incorporated by reference.

1. Field of the Invention

The present invention relates to an imaging system.

2. Discussion of Prior Art

In order for a mammalian eye to be able to observe objects over a wide range of light intensity levels, a mammalian retina comprises five general types of neurons organised into a two layer system. A first layer, the outer plexiform layer, consists of detector, horizontal and bipolar neurons. It has been shown that the detector neurons' response is a logarithmic function of the photon flux. Signals from the detector neurons are passed to the horizontal neurons which allow the signals to spread laterally. The bipolar neurons respond to the differences between the signals from the detector and horizontal neurons. The result is a bipolar neuron response which is a function of the spatial and temporal changes in the response of the detector neurons and the response is relatively insensitive to changes in the overall illumination level.

Electronic sensors such as charge coupled device sensors generally operate over a limited range of illumination levels. Commercial camera systems often incorporate an automatic gain control to alter the operating point depending on the level of illumination. Where there is a bright light source within a scene, the automatic gain control results in the loss of detail in the scene.

In a natural scene, the light intensity L(x,y) reflected from an object having a reflection coefficient R(x,y) under an illumination level I(x,y) is given by the equation:

$$L(x,y)=I(x,y)R(x,y).$$

Within any scene, the illumination level may typically vary by up to two decades whilst the reflectivity might vary by up to one decade, giving a maximum of three decades of variation in intensity. In order to detect intensity changes at a level of one per cent over an intensity range of three decades after digitisation of the sensor output, approximately seventeen bits per pixel would be required. In contrast, when the image is displayed, for example using a cathode ray tube, a human operator can only distinguish approximately one hundred grey levels, which corresponds to about seven bits. Large amounts of information are therefore lost.

A logarithmic detector response D(x,y), is given by the equation, $$D(x,y)=\log(R(x,y))+\log(I(x,y)).$$

If a spatial average response is subtracted from the detector response, this will have the effect of attenuating the contribution from the I(x,y) term more than that from the R(x,y) term. A retina which attenuates the intensity contribution due to the illumination level relative to the contribution due to the reflection coefficient reduces the dynamic range required to represent a scene without losing the critical information represented by R(x,y). In the case of the mammalian eye, the outer plexiform layer converts a large dynamic range input into a smaller dynamic range output.

Sensors which mimic the behaviour of mammalian retinas are sometimes referred to as artificial retinas. Artificial retina structures have been reported previously. An artificial retina structure has been described by C. A. Mead in "Analog VLSI and Neural Systems", Addison Wesley, 1989 and illustrated by FIG. 1. The Mead structure suffered from two disadvantages. The structure had a slow response time and so was limited to bright scenes and mismatch between devices meant that only objects with a relatively high contrast could be observed. In addition, the number of devices within each pixel meant that the smallest possible size of 109 μm by 97 μm was relatively large, limiting the spatial resolution of the structure.

K. A. Boahen and A. G. Andreou, in Int. J. Comp. Vision, Volume 8 (1992), pages 764 to 772, proposed a retina with fewer devices per pixel. This retina comprised two networks of lateral devices connected within each pixel with a small feedback loop. The Boahen and Andreou retina suffered from the disadvantage that corrections required to overcome device variations were illumination dependent.

United Kingdom Patent Application No. 9204434.6 describes a differential amplifier incorporating floating gate devices which are programmable to correct imbalances arising from device mis-match. The devices therein are arranged to operate above a device threshold voltage such that the devices are operating in saturation.

French published patent specification FR-A-2 543 363 describes an analogue integrated circuit using transistors whose threshold voltage is electrically adjustable, together with a comparator suitable for controlling the adjustment of the potentials on the floating gates of two floating gate devices. The transistors of the analogue circuit are arranged to operate above the threshold voltage, where the current in the transistor is directly related to the threshold voltage. For a field effect transistor operating above the threshold voltage, the current through the transistor, $I_D$ is given by the expression:

$$I_D=\beta(V_{gs}-V_T)^2$$

where $\beta$ and $V_T$, the threshold voltage, are device dependent parameters. Adjusting the threshold voltage of a floating gate transistor may reduce the effect of this device dependent parameter but differences between devices of $\beta$ still remain. The teaching of FR-A-2 543 363 indicate that field effect transistors are not suitable for operation below the threshold voltage, referring to two distinct modes, a "blocked mode" (un mode bloqué) and a "conductive mode" (un mode conducteur), the threshold voltage separating the two modes.

Analogue image processing was reviewed by S. Collins and M. Wade in a scientific paper presented to an IEE Symposium "Integrated Image Sensors and Processing" on Dec. 5th 1994. In this paper, the suitability of an imaging system comprising a logarithmic detector and a centre-surround receptive field for use as a surveillance system was discussed. This paper indicated that such a system would be advantageous since a typical scene has an intensity histogram which exhibits a multi-modal distribution whereas a processed image would have a uni-modal distribution, which could be more efficiently encoded as a digital signal. The paper did not provide an example of such a system nor any indication as to how one may be constructed. The results presented therein were the results of a computer modelling exercise.

BACKGROUND OF THE INVENTION

It is an object of the invention to provide an alternative imaging system.

The present invention provides an imaging system incorporating (i) detecting means incorporating multiple detector elements arranged to detect electromagnetic radiation from a scene and to generate pixel image signals in response thereto; and (ii) processing means for filtering the pixel image signals spatially and for generating processed image output signals having a dynamic range which is less than that of radiation from the scene, characterised in that (iii) each detector element is incorporated in a respective pixel circuit arranged to provide a pixel image signal which is substantially a logarithmic function of incident radiation intensity and has reduced dynamic range in comparison thereto;

(iv) the processing means is spatially separate from the detecting means and is arranged to provide high-pass spatial filtering; and (v) the pixel circuits and the processing means are arranged in combination to selectively counteract the illumination dependence of pixel image signals and to provide an edge-enhanced representation of the imaged scene.

Separating the detecting means from the processing means and incorporating means for generating pixel image signals whose dynamic range is less than that of an image intensity at a respective pixel and substantially a logarithmic function of the image intensity at the pixel provides the advantages that:

(a) the size of pixels within the detecting means may be reduced compared with the Mead arrangement, with consequently greater resolution;

(b) the system is responsive to a greater range of radiation received thereat and provides enhanced dynamic range reduction in addition to dynamic range reduction provided by spatial filtration performed in the processing means; and (c) processing means dynamic range performance requirements are relaxed by performing dynamic range compression in the detecting means.

The system may incorporate means for outputting a digitised filtered image signal such that each pixel image signal is presented by not more than five bits in the digitised signal. This provides data which retains essential image information and is recordable without demanding considerable digital storage memory capacity.

The imaging system may include electronically programmable correcting means for correcting for variations in pixel response to radiation incident thereupon. Variations in pixel elements may, if uncorrected, reduce the sensitivity of an imaging system. Correcting pixel non-uniformities may increase the sensitivity of an imaging system.

The correcting means may comprise a floating-gate field-effect transistor configured to provide a correction dependent upon charge stored in one or more of its floating gates. This provides a practical configuration for correcting variations in pixel response where the detecting means incorporates a large number of pixels.

The imaging system of the invention may form the basis for an electronic photographic system where processed images are stored and then later displayed.

BRIEF DESCRIPTION OF THE DRAWINGS

In order that the invention may be more fully understood, embodiments thereof will now be described, by way of example only, with reference to the accompanying drawings, in which.

DETAILED DISCUSSION OF EMBODIMENTS

Figure 1:
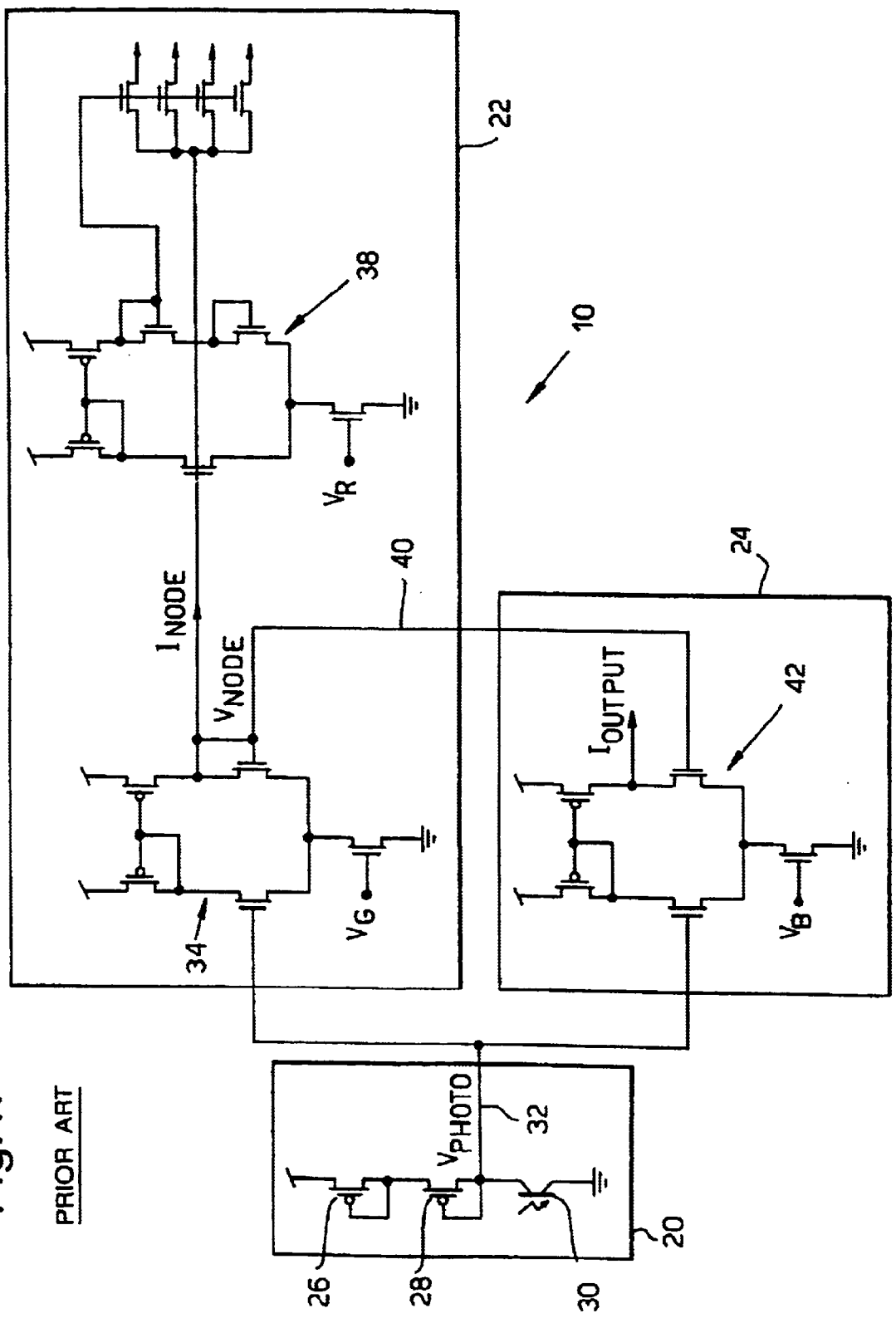
FIG. 1 shows a prior art imaging system.

Referring to FIG. 1 there is shown a circuit diagram of a single pixel 10 of a prior art silicon retina developed by Mead referred to earlier. The pixel 10 comprises a receptor unit 20, a lateral averaging unit 22 and an output unit 24. The receptor unit 20 is a logarithmic detector comprising two diode connected channel metal oxide semiconductor field effect transistors (MOSFETs) 26 and 28 and a p-n-p phototransistor 30. An output 32 from the detector unit 20 is connected to both the lateral averaging unit 22 and the output unit 24.

The lateral averaging unit 22 comprises a transconductance amplifier 34. The unit 22 calculates a local average response using a network of lateral connections 36 to adjacent pixels. The amount of current injected into the network within each pixel through the transconductance amplifier 34 is dependent upon the difference between the voltage of the network, $V_{Node}$ and the output voltage of the receptor unit 20, $V_{photo}$, thereby creating a weighted local average of the pixel outputs. The averaging process is controlled by the conductance of the transconductance amplifier 34 and the resistance of MOSFETs in the unit 22. To ensure the conductance of the MOSFETs is illumination independent, a second transconductance amplifier 38, referred to by Mead as a horizontal resistor (HRes) circuit, is included in the unit 22. The local average voltage is passed on an output 40 to the output unit 24.

The output unit 24 is a further transconductance amplifier 42. The amplifier 42 amplifies the difference between the local average voltage and the receptor unit voltage, $V_{photo}$, creating a high-pass filtered output of a logarithmic representation of the input image with low spatial frequencies removed.

Biological retinae share at least two common features: detectors whose response is proportional to the logarithm of the incident photon flux and output neurons with antagonistic centre-surround receptive fields. In an antagonistic centre-surround receptive field, the response of an output neuron is proportional to the difference between an average of the responses of a small central group of detectors and that of a larger surrounding group. The response of the output neurons with this type of receptive field can be modelled by convolving the logarithm representation of the field with a Difference of Gaussian (DoG) filter, $f_{(DoG)}$ $$f_{DoG}(i,j) = A \exp{-(i^2+j^2)/2\sigma_p^2} - B \exp{-(i^2+j^2)/2\sigma_n^2}.$$

In order to represent an antagonistic centre-surround receptive field, both A and B must be positive and $\sigma_n > \sigma_p$. Convolving this function with an image in the spatial domain is equivalent to multiplying the Fourier transform of the scene by the Fourier transform of the convolution kernel $f_{DoG}$. The Fourier transform of a Gaussian is a low pass filter with a characteristic frequency which is inversely proportional to the width parameter, $\sigma$. Combining two Gaussians in a DoG filter results in a band-pass filter. This filter removes all the high frequencies. In contrast, the amount of low frequency attenuation is determined by the values of A and B. If A and B are normalised so that the output from convolving the filter with a constant scene is zero, then the lowest frequencies are also removed. However, some low-frequency components can be retained if B is smaller than this critical value. Overall the DoG filter is a band-pass filter in which the high frequencies are removed and low frequencies are either attenuated or removed.

Although a biological retina incorporates band-pass filters, a high-pass filter is all that is required to create the desirable illumination independent output. This type of filter may be one which takes the difference between a detector response and a Gaussian-weighted local average. This is computationally less expensive than a DoG filter.

Figure 2:
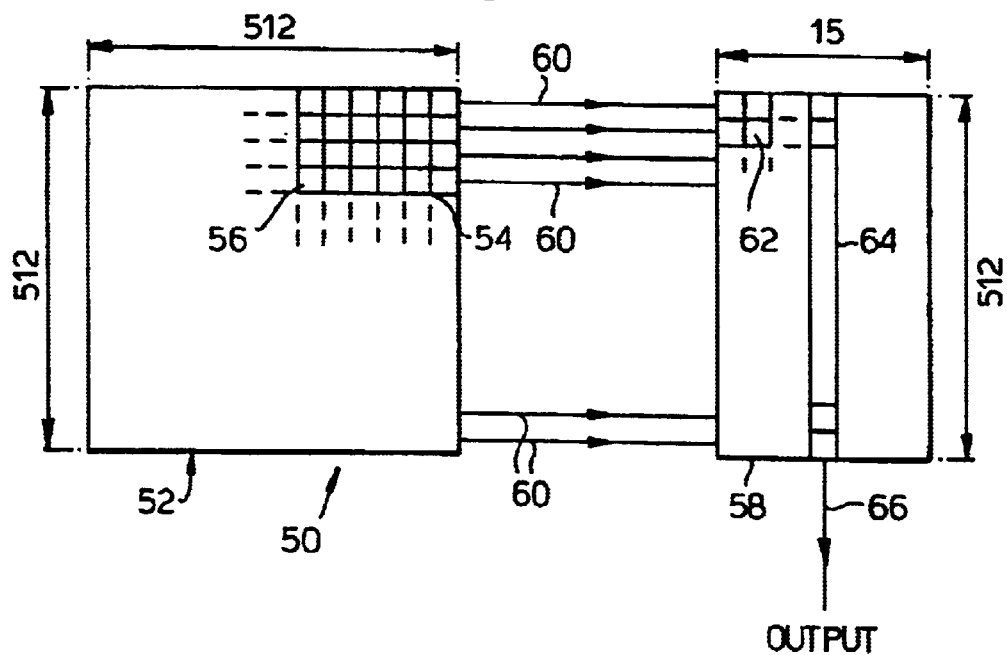
FIG. 2 shows an imaging system of the invention.

Referring now to FIG. 2 there is shown in schematic form an imaging unit 50 of the invention. The imaging unit 50 comprises a detector unit 52, having an array 54 of detector pixels such as pixel 56, and a bar filter unit 58. The array 54 is square, having 512 columns and 512 rows of pixels. Each detector pixel, such as pixel 56, has a logarithmic response to incident light. Each pixel generates a voltage in response to incident light. Each row of pixels has a respective row output 60. The pixels within a column are simultaneously read out in parallel to the bar filter unit 58 via the row outputs 60. Since there are 512 rows of pixels, there are 512 row outputs 60.

The bar filter unit 58 comprises an array of circuit elements such as element 62. The unit 58 has fifteen columns and 512 rows of circuit elements. The unit 58 has a central column 64 of circuit elements which include respective output devices (not shown). The circuit elements in the central column 64 are thus modified from the circuit elements in the other fourteen columns. The bar filter unit 58 calculates a local average response and generates output signals dependent on differences between individual detector pixel outputs and the local average response. The output signals from circuit elements in the central column 64 are sequentially connected to an imaging unit output 66. As the voltages from each column of pixels in the detector unit 52 are passed to the bar filter unit 58, the unit 58 moves previous pixel voltages, stored in each circuit element, one column to the right. For an imaging unit operating at a frame rate of 50 Hz, each column of pixel voltages is processed in approximately 40 μs and the total storage time for a particular pixel output in the bar filter unit 58 is fifteen times this figure, or approximately 0.6 ms.

By separating the detector unit 52 from the bar filter unit 58, the size of the pixels in the detector unit 52 may be smaller than the minimum size of pixels in the prior art system of FIG. 1 since fewer circuit elements are required. By reducing the pixel size, a greater resolution is obtainable.

Figure 3:
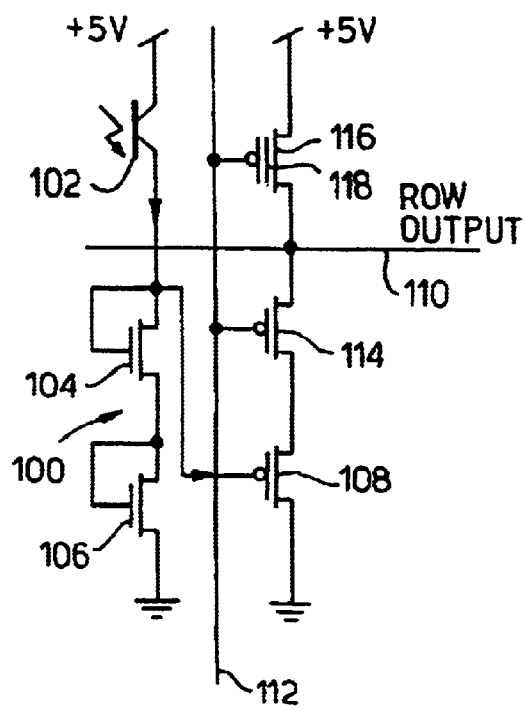
FIG. 3 shows a detector pixel circuit of the FIG. 2 system.

Referring now to FIG. 3 there is shown a detector pixel circuit 100. Each of the detector pixel circuits of the FIG. 2 detector unit incorporates the detector pixel circuit 100. The circuit 100 contains a bipolar phototransistor 102 which converts a photon flux into a current. The photocurrent from the phototransistor 102 is injected into two diode connected n-channel MOSFETs 104 and 106 operating in series which convert the photocurrent into an output voltage. A p-channel source follower MOSFET 108 provides sufficient drive for the output voltage to be read via a common row output line 110. The row output line 110 corresponds to the row output 60 of FIG. 2. Which pixel from a row is connected to an output line is controlled by a column select signal on a column select line.

When a column select line 112 is in a logical 'high' state, a pass transistor 114 is conducting and the voltage on the row output line 110 is determined by the output voltage of the pixel circuit 100. For the pixel circuit 100 the logical 'high' state corresponds to 0 volts on the select line 112 and a logical low state corresponds to +5 volts on the line 112. The circuit 100 incorporates a p-channel floating gate MOSFET 116 which acts as a programmable current source. The MOSFET 116 only acts as a current source when the column select line 112 is at logical high. To achieve this, there is a coupling capacitance $C_{pp}$ between the line 112 and the floating gate 118. If the floating gate 118 has a capacitance $C_{tot}$, then a change in voltage $\Delta V_{select}$ causes a change in floating gate potential of $C_{pp}\Delta V_{select}/C_{tot}$. The initial floating gate potential and the change in potential when line 112 changes state must together ensure that the channels of de-selected devices are blocked.

Figure 4A:
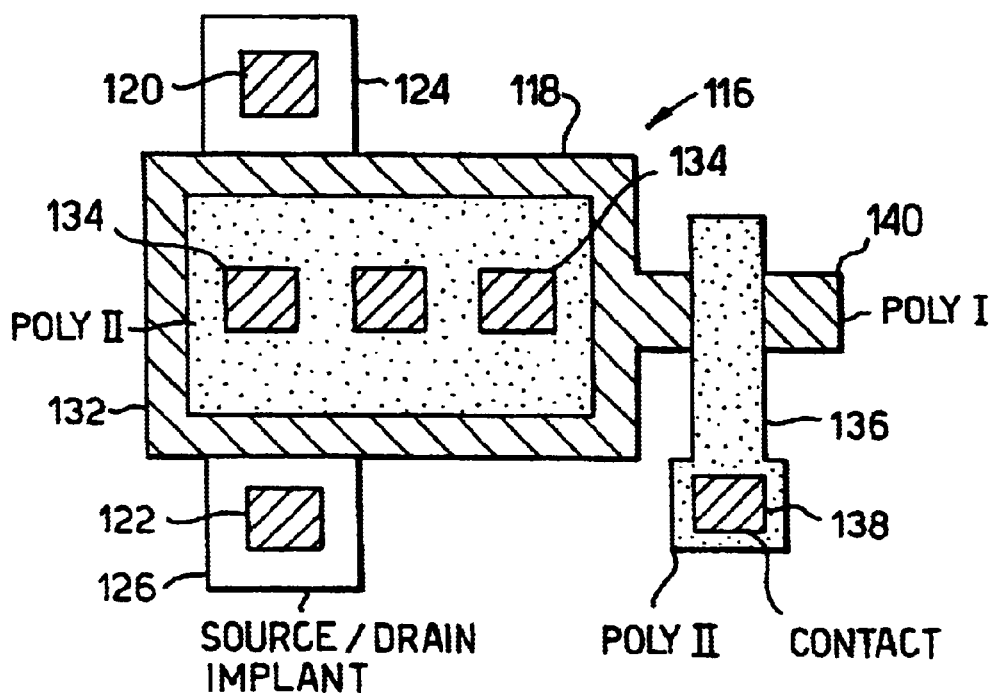
FIG. 4 is a schematic diagram of a floating gate MOSFET.
Figure 4B:
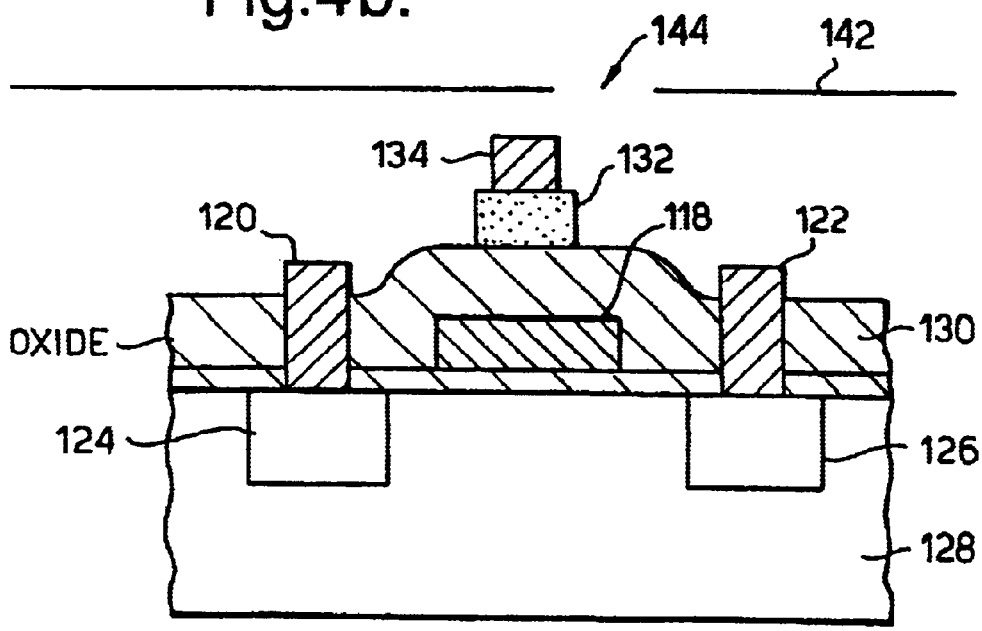

Referring to FIG. 4 also, there is shown in schematic form a diagram of the MOSFET 116. FIG. 4a shows the MOSFET 116 in plan view and FIG. 4b is a sectional view of the MOSFET 116 along a line IV—IV in FIG. 4a. The MOSFET 116 has a source contact 120 and a drain contact 122, each of which contact respective implant regions 124 and 126 in a n-type substrate 128. The poly-silicon floating gate 118 is surrounded by an oxide region 130. A poly-silicon control gate 132 with contacts 134 overlies the floating gate 118. In order to inject charge onto the floating gate 118, a poly-silicon tunnelling injector 136, having a contact 138, overlies a limb 140 of the floating gate 118. Charge is injected onto the floating gate 118 when a high voltage is applied to the injector 136 through an electron tunnelling process. The ability to alter the charge on the floating gate is required in order to trim the operation of the circuit 100 to reduce inter-pixel variations. An injector select line (not shown) is connected to the contact 138 and to contacts of other tunnelling injectors in the same row as the circuit 100.

The current-voltage characteristics arising from the tunnelling process mean that if a high voltage is applied to all the injectors within a row, the difference in floating gate potentials between the selected and de-selected devices must ensure that only the selected device will be programmed. The coupling of the select signal onto the floating gate distinguishes the selected device from the rest of the population. In consequence, changing the select signal between its two states should change the floating gate potential by at least three volts. If the select signal is either 0 V or 5 V, then the ratio of the capacitance of the control gate 132 capacitance to the total floating gate capacitance is at least 0.6.

The diode connected MOSFETs 104 and 106 are operated in a sub-threshold regime. MOSFET device characteristics are described by S. M. Sze in "Physics of Semiconductor Devices", John Wiley & Sons, New York, 1981, pages 431 to 510, where the term sub-threshold is explained. The response of the phototransistor 102 is, tailored, by for example controlling its size, so that the photocurrent generated at a maximum operating illumination level is not sufficient to drive the MOSFETs 104 and 106 above the subthreshold regime. It has been found that for a diode-connected load MOSFET operating in the sub-threshold regime that the input current, $I_{in}$, is related to the gate-source potential, $V_{gs}$, by the equation, $$I_{in}=GI_{photo}=I_0 \exp(\kappa V_{gs}/U_T) \quad (1),$$

where $I_0$, $\kappa$, and $U_T$ are device parameters, G is the gain of the phototransistor 102, and $I_{photo}$ is the photon flux at the phototransistor. For an n-channel device in which the source is connected to earth, equation (1) may be rearranged to give the expression $V_{out}=U_T \ln[I_{in}/I_0]/\kappa$. Although the phototransistor 102 is connected to two diode connected MOSFETs, equation (1) remains generally applicable and the output voltage is still a function of the logarithm of the photocurrent.

The source-follower MOSFET 108 is operated in saturation such that the device has an output voltage $V_{out}$ related to an input voltage $V_{in}$ by the equation, $$V_{out} = V_{in} - V_T - \sqrt{\frac{2I}{\beta}} \quad (2),$$

where I is the source current and $V_T$ and $\beta$ are device parameters. The floating gate MOSFET 116 provides a programmable current source within the pixel for trimming variations in both the variations of the parameters of the MOSFET 108, $V_T$ and $\beta$, and variations in $V_{in}$ such as variations in the gain G of the phototransistor 102 or the device parameters of the MOSFETs 104 and 106.

In order to facilitate programming of the MOSFET 118, random charge on the floating gate 118 arising during a fabrication process must be removed in an initialisation process. This is achieved by exposing the circuit 100 to ultra-violet radiation through a metal screen 142. The screen 142 has a hole 144 aligned so that it is above a region where the control gate 132 overlaps the floating gate 118. In the presence of ultra-violet radiation, the floating gate 118 is effectively shorted to the control gate 132 through a large resistance, and the floating gate reaches equilibrium with a potential close to a potential set on the select line 112. The voltage applied to the select line 112 during the ultra-violet irradiation should be slightly greater than the normal maximum operating voltage, which is 5 V. If the voltage is set at 6 V, when the MOSFET 116 is de-selected, with the voltage on the line 112 being at 5 V, and a ratio of $C_{pp}/C_{tot}$ equal to 0.6, the floating gate potential would be at approximately 5.4 V. When the MOSFET 116 is selected, the potential on the line 112 being 0 V, then the floating gate potential would be at 2.4 V, low enough to turn the device on. This initialisation process thus ensures that de-selected devices are turned off whilst only selected devices are turned on.

After the initialisation process has been performed, each pixel circuit is trimmed to remove inter-pixel variations. In this process, the detector unit 52 of FIG. 2 is biased into its normal operating mode and a uniform illumination is applied to the detector array 54. The output from each pixel is then compared to a desired output. If these two values are not within the required tolerance, then logic elements (not shown) switches a high voltage pulse onto the required injector select line. If the voltage on the floating gate 118 requires raising, the line 112 is set to 0 V and the high voltage pulse is switched onto the injector select line connected to the injector 136. The floating gate potential on other devices in the same row are substantially unchanged since their respective select lines are set at 5 V.

Increasing the potential on the floating gates of the MOSFETs such as MOSFET 116 has the effect of decreasing the current through the floating gate device and the output voltage placed on the row output line such as the row output line 110 will be reduced. The desired output voltage must therefore be lower than the lowest expected initial voltage after the initialisation process. Each pixel is programmed with several pulses until the output voltage is equal to the desired value.

Figure 5:
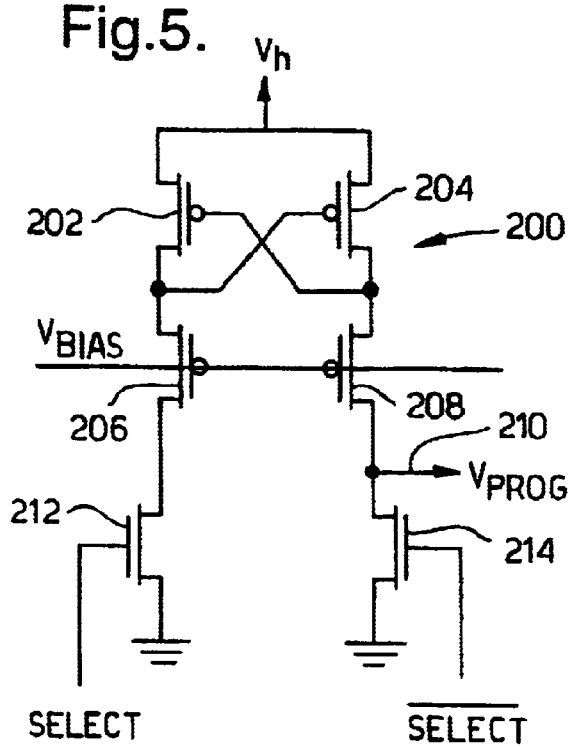
FIG. 5 shows a high voltage routing circuit.

Referring now to FIG. 5 there is shown a circuit 200 suitable for routing a high voltage pulse onto the injector select lines of the FIG. 3 circuit. The circuit 200 is described by J. R. Mann in "Floating-gate circuits in MOSIS", Technical Report 824. Massachusetts Institute of Technology, Lincoln Laboratory, November 1990. The circuit 200 comprises two pairs of p-channel MOSFETs 202 to 208 connected in series. A positive high voltage signal is switched to an output line 210 by switching a low voltage input signal and its complement to respective n-channel MOSFETs 212 and 214. The devices in the circuit 200 are configured so as to have an increased breakdown voltage compared with conventional MOSFETs. As described by Mann. low dose implants are used to modify the device drain structure. In operation, the circuit 200 provides 14.4 V pulses. This voltage will produce an estimated programming current of 0.2 pA. It is estimated that under these conditions, deselected floating gate MOSFETs receive a programming current of approximately $10^{-10}$ pA. If the high voltage pulse is applied for 10 $\mu$s, then with a total floating gate capacitance of 0.1 pF, each pulse causes a shift in the potential on the floating gate of 20 $\mu$V. If the initial offset error was 50 mV, two thousand five hundred pulses would be required to trim one pixel circuit.

Whilst the pixel circuit 100 has been described as incorporating a bipolar phototransistor 102, other forms of photodetector could be incorporated into a pixel circuit. Bipolar detectors are suitable for use at low levels of illumination. However, above illumination levels of approximately 1 W/m$^2$, corresponding to office lighting conditions, a bipolar device may create too much photocurrent and the load devices operate non-logarithmically. At illumination levels of 1 kW/m$^2$, corresponding to bright sunlight, the load devices would operate in saturation rather than subthreshold. The phototransistor 102 may be replaced by a photodiode. A photodiode of area $10^{-10}$ m$^2$ generates a photocurrent of approximately 25 pA under an illumination level of 1 W/m$^2$. If the photocurrent exceeds a maximum value of typically 100 nA, the exponential current voltage characteristic is no longer valid. For a $10^{-10}$ m$^2$ photodiode, this current corresponds to an illumination level of 1 kW/m$^2$, equivalent to bright sunlight. Brighter illumination levels will lead to a non-logarithmic response though deviations from ideal will be gradual, and the upper limit is therefore a soft limit.

The lowest usable illumination level is determined by the response speed of the detector. When the illumination level, and hence the photocurrent, changes, the gate voltages of the load devices must change to balance the current flow within the pixel. This response is delayed by capacitances within the pixel. Load devices of size 10 $\mu$m×10 $\mu$m give a load capacitance of 200 fF. Assuming this capacitance C is discharged by the change in photocurrent $\Delta I_p$, resulting in a change in output voltage $\Delta V$, the time constant $\tau$ is approximately equal to $C\Delta V/\Delta I_p$. For a one percent change in photocurrent, $\Delta V$ for a photodiode is approximately 1 mV, which under office lighting conditions gives a value of $\tau$ of 0.16 ms which would be suitable for resampling the pixel at 50 Hz. In moon-light, a photocurrent of 25 fA could be expected with an associated time constant of 160 ms. A photodiode would thus respond too slowly under these lighting conditions. Bipolar phototransistors proved greater photocurrent and so are better suited to low light levels. In order to use phototransistor based pixels over a wide range of illumination levels, a detector could be fitted with an automatic iris. It may be possible to replace the photodetector and the associated load devices with a photovoltaic device, such as that described by J. Mann in SPIE, Volume 1473, "Visual Information Processing: From Neurons to Chips", (1991), pages 128 to 136.

Figure 6:
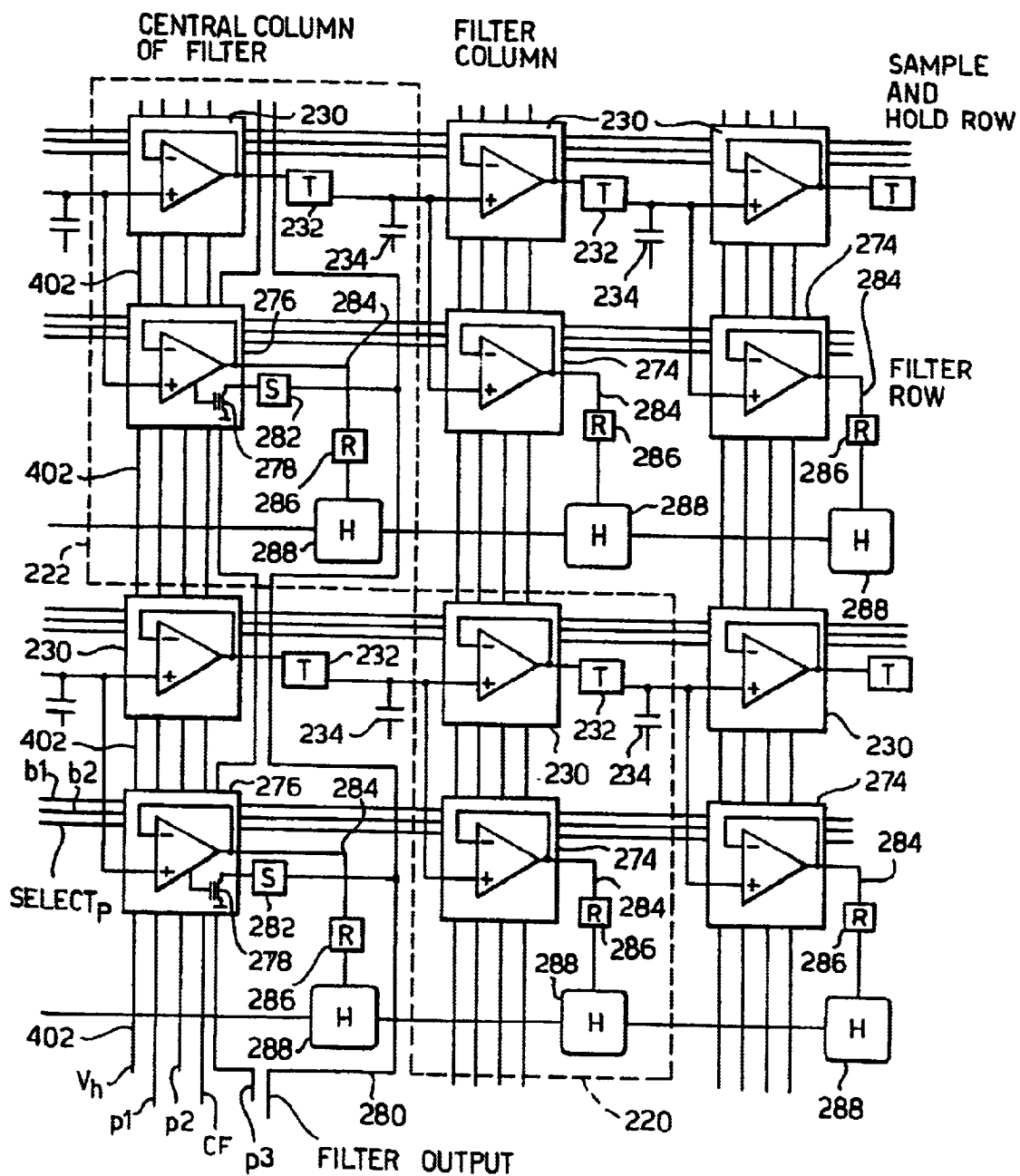
FIG. 6 shows a part of a bar-filter unit of the FIG. 2 system.

Referring now to FIG. 6, there is shown a section of the FIG. 2 bar filter unit 58. The bar filter unit 58 comprises fourteen columns of circuit elements such as a circuit element 220 and a single column of circuit elements such as a circuit element 222. There are seven columns of circuit elements such as the element 220 on either side of the column of circuit elements such as the circuit element 222. There is some commonality of components between the elements 220 and 222. Each element 220 and 222 includes a buffer unit 230. The buffer units 230 are part of a sample and hold arrangement for passing data across the bar filter unit 58. Each element 220 and 222 include a transmission gate 232 and a capacitance 234. The transmission gates 232 act as switches which can connect and disconnect an output from one buffer unit 230 from the capacitance 234 to its immediate right. Data is moved across a row by closing each transmission gate in turn starting from the right using a vertical control line (not shown) which controls all the equivalent transmission gates in each column. If a transmission gate is closed when all the others in the same row are open, the result will be to shift data across the array to the right.

Figure 7:
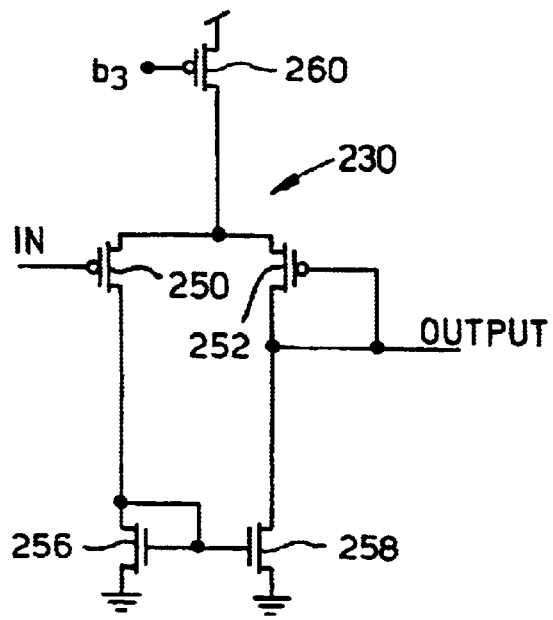
FIG. 7 shows a buffer unit of the FIG. 6 bar-filter unit.

FIG. 7 shows a diagram of a buffer unit 230 at component level. The buffer unit is a standard transconductance amplifier having two well-connected p-channel MOSFETs 250 and 252. A well-connected MOSFET is a MOSFET which has a substrate which is electrically connected to its source. The MOSFETs 250 and 252 are connected to form a source coupled pair. The gate of the MOSFET 252 is connected to an output 254 which itself is connected to the drain of the MOSFET 252. The buffer unit 230 has two n-channel MOSFETs 256 and 258, the gates of which are connected together. The MOSFET 256 is diode connected with the source and gate being connected together. A voltage at a node b3 from a signal line (not shown) controls current flowing in to the buffer unit 230 through a p-channel MOSFET 260.

Referring again to FIG. 6, the elements 220 and 222 will now be described in more detail. Apart from the sample and hold units, the elements 220 and 222 include respective averaging units 274 and 276 for calculating a local average response. The averaging units 274 and 276 are each a modified operational transconductance amplifier. The averaging units 274 and 276 are substantially similar but each averaging unit 276 includes an additional MOSFET 278 for providing an output.

The filtered outputs from the central column of circuits 222 are connected to an output line 280 through respective transmission gates 282. The output line 280 is in turn is connected to the FIG. 2 imaging unit output 66. The averaging units 274 and 276 each have an output 284 which connects each unit to its four nearest neighbours. The outputs 284 pass through respective transmission gates 286 to biasing units 288 which allow current injected from an output 284 to spread between neighbouring units such that the voltage at which the current is injected represents a local average of the pixel voltages. For clarity of illustration, vertical connections between neighbouring biasing units 288 are not shown in FIG. 6.

Figure 8A:
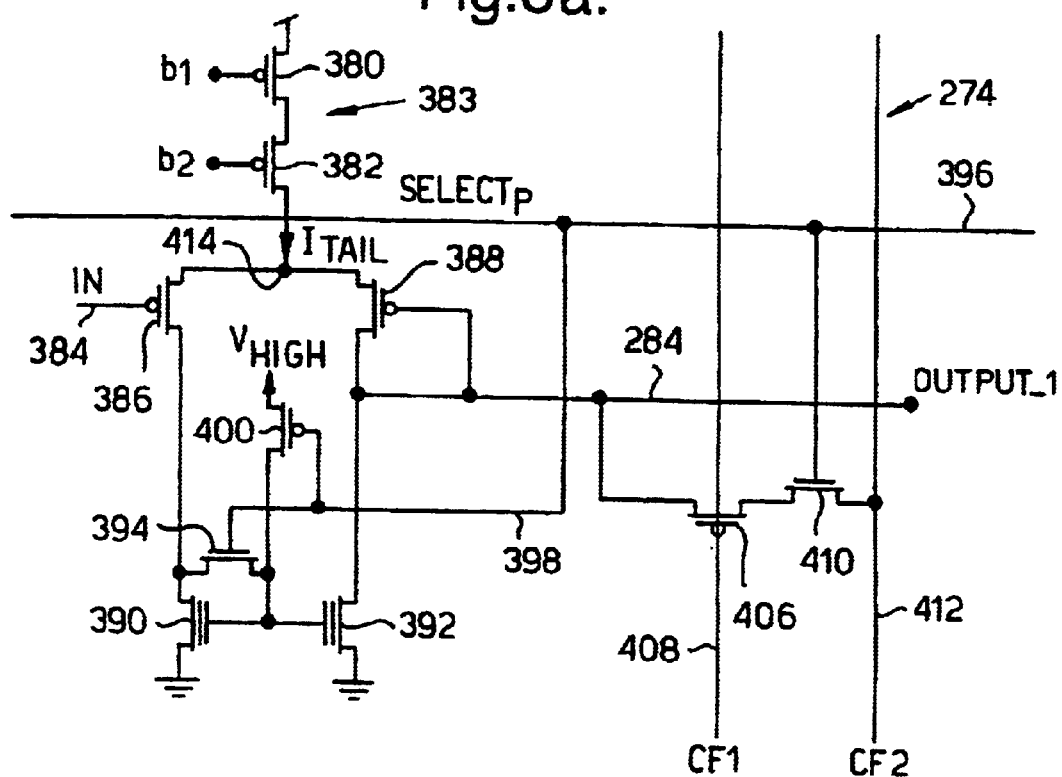
FIG. 8a shows an averaging unit of the FIG. 6 bar-filter unit.

FIG. 8a shows an averaging unit 274 in component form. The unit 274 has two p-channel MOSFETs 380 and 382 which are biased by potentials at nodes b1 and b2 respectively. The MOSFETs 380 and 382 act as a constant current source 383. The potentials at nodes b1 and b2 are created by a source (not shown) comprising a current generator connected to two diode connected MOSFETs, the potentials at b1 and b2 being the respective gate potentials of the two MOSFETs. The unit 274 receives an input voltage from the FIG. 6 capacitor 234 of the circuit element 220 or 222 immediately to its left in FIG. 6 on an input line 384. The input line 384 is connected to the gate of a p-channel MOSFET 386. The unit 274 has a second input device, a further p-channel MOSFET 388. Both of the MOSFETs 386 and 388 are well-connected—that is, their substrate is connected to their source. The MOSFETs 386 and 388 are connected to form a source coupled pair with the constant current source 383 acting as a common source bias. N-channel floating gate MOSFETs 390 and 392 act as drain loads to the MOSFETs 386 and 388. Connections between associated MOSFETs 386/390 and 388/392 are drain to drain. The sources of the MOSFETs 390 and 392 are connected to earth; their gates are connected together and they act in combination as a current mirror circuit.

The common gate connection of the MOSFETs 390 and 392 is connected to the common drain connections of MOSFETs 386 and 390 through an n-channel MOSFET 394. When the MOSFET 394 is conducting, it forms a diode connection to the MOSFET 390, which is required for normal operation. The gate of the MOSFET 394 is connected to a programming rail 396 by a line 398. A p-channel MOSFET 400 has its gate connected to the line 398. The drain of the MOSFET 400 is connected to the drain of the MOSFET 394 and the gates of the MOSFETs 390 and 392. The source of the MOSFET 400 is connected to a V$_{high}$ rail, not shown in FIG. 8a but shown in FIG. 6 as a rail 402.

The output 284 of the averaging unit 274 is connected to the common drain connection of the MOSFETs 388 and 392. The output 284 is also connected to the gate of MOSFET

388. A p-channel MOSFET 406 has its gate connected to a first column feedback line 408 and its source and drain terminals are connected to the output 284 and to a source/drain terminal of an n-channel MOSFET 410. The gate of the MOSFET 410 is connected to the programming rail 396 and its other source/drain terminal is connected to a second column feedback line 412. The source/drain terminals of the MOSFETs 406 and 410 are not distinguished since the relative potentials on these terminals are not predictable.

The operation of the averaging unit 274 will now be described. The constant current source 383 feeds a current $I_{tail}$ to a node 414. The magnitude of $I_{tail}$ is such that the MOSFETs of the unit 274 operate in a sub-threshold regime, where the current through a device, $I_D$, follows the relationship $I_D \approx I_0 e^{\kappa V_{gs}}$, where $I_0$ is a device dependent parameter. The current $I_{tail}$ is divided between the MOSFETs 386 and 388 in a ratio depending on their differential gate voltage. If the gate voltages are equal, the same current, $I_{tail}/2$, flows through each device. When a unit 274 is selected, the line 396 is at 5 V, and the MOSFET 394 is conducting. The current which flows through the MOSFET 390, equal to the current through the MOSFET 386, is then equal to the current through the MOSFET 392. If there is a voltage difference between the potentials on the gates of the MOSFETs 386 and 388 then current is either injected onto or received from the output 284. The output 284 is connected to the outputs of immediately surrounding averaging units and so the effect of the averaging unit 274 is that if the voltage input on the line 384 is different form the local average input, a current flows and due to resistive effects the local average voltage changes to a certain degree, thereby updating the local average.

Whilst the above operation of the averaging unit 274 describes the normal operation of the unit, it is necessary to carry out a trimming operation in order to reduce the effect of variations in $I_0$ between devices within the unit. In the trimming operation, the potentials on the floating gates of the floating gate MOSFETs 390 and 392 are adjusted. In an initialisation step, residual random charge on the floating gate devices is removed by exposing the device to ultraviolet radiation. In order to achieve this, the floating gate bar filter unit 58 is fabricated with a metal shield layer covering most of the circuits; the shield layer having a window above an area where the control gate overlaps the floating gate. The shield layer also protects the circuit from visible light during normal operation. Since areas near to the window will not be protected from visible light, the window is placed at the source end of the floating gate. The initialisation process is only required to achieve approximate equality between the potentials of the two floating gates. During the initialisation process, the line 396 is held at 5 V in order to allow the MOSFET 394 to conduct and the unit 274 to operate normally.

After initialisation, the unit 274 may be trimmed to counteract device variations. In order to trim the unit 274, a known constant signal, chosen to represent a typical signal input and perhaps 2.5 V, is fed into the sample and hold circuits comprising the buffer units 230, the transmission gates 232 and the capacitances 234 and therefore consequently to the input line 384. The constant signal is supplied from an on-chip voltage source (not shown) and is connected to the bar filter unit 58 through transmission gates (not shown) which selectively connect either the signals from the detector unit 52 during normal operation or the constant signal during trimming operation. This arrangement enables the trimming of the detector unit 52 and the bar filter unit 58 to be carried out in parallel. The units 274 are trimmed one row after another. The row containing the units 274 which are to be trimmed is selected by setting the appropriate line 396 high and all other equivalent lines in the unit 58 low. A global control signal (not shown) is sent to all the transmission gates 286 in FIG. 6 to disconnect all the units 274 from other similar units. The line 412 is then set to the same voltage as the signal on the input line 384 and the line 408 is set low. The MOSFETs 406 and 410 are then conducting. Current flowing in the line 412 is then the output current when the two input voltages to the unit 274 are equal and is monitored. A double comparator arrangement shown in FIG. 9 may be used to determine whether the output current should be either increased, decreased, or if approximately zero remain unchanged. A double comparator arrangement is described in FR-A-2 543 363. The current may be changed by putting a high voltage pulse on either or both of respective programming lines for the floating gate MOSFETs 390 and 392. These programming lines are indicated as vertical lines p1 and p2 respectively connected to units 274 within a column in FIG. 6 but are omitted from FIG. 8a for clarity. The high voltage pulses are supplied by a circuit similar to the circuit 200 shown in FIG. 5, one of which is connected to each programming line.

When a unit 274 is deselected, the line 396 is low and the unit 274 is therefore isolated and the channel of the MOSFET 400 is conducting rather than the MOSFET 394. The voltage $V_{high}$ is then capacitively coupled through onto the floating gates of MOSFETs 390 and 392. In order to ensure selective programming of floating gate MOSFETs within a column, the voltage change induced on the floating gates of MOSFETs of deselected units must be at least 3 V. This may be controlled by having a large control-gate to floating-gate coupling capacitance or by using the largest possible value of $V_{high}$, which saves circuit area. To turn off the MOSFET 400, the voltage which is applied to the line 396 must be at least as high as the voltage $V_{high}$ applied to the source of MOSFET 400.

To compensate for changes due to leakage currents during the trimming operation of voltages stored on the capacitances 234, these voltages must be regularly updated as the trimming proceeds. Once the units 274 within a row have been trimmed, the units 274 in a next row are then selected by setting their line 396 high.

Figure 8B:
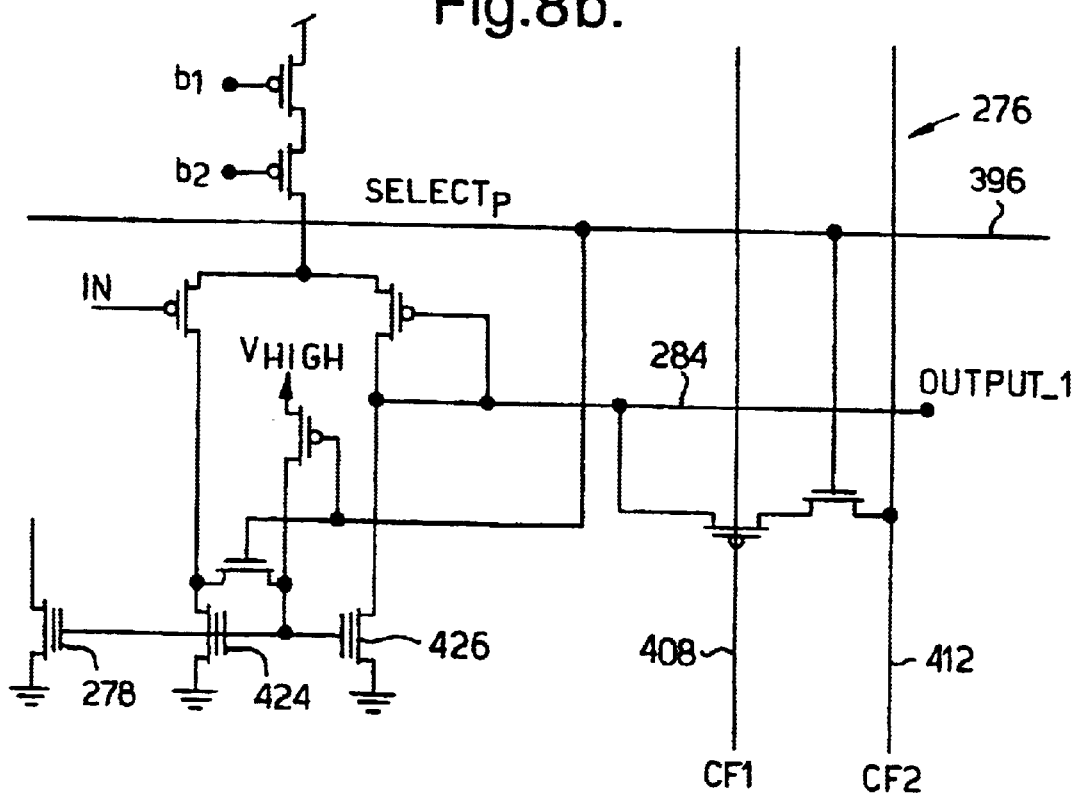
FIG. 8b shows a further averaging unit of the FIG. 6 bar-filter unit.

Referring also now to FIG. 8b, there is shown an averaging unit 276 from a circuit element 220 of FIG. 6. The averaging unit 276 is essentially similar to the averaging units 274, the only difference being that the gate of the output MOSFET 278 is connected to the connection between floating gate devices 424 and 426 equivalent to the MOSFETs 390 and 392 of the unit 274. The MOSFET 278 is a n-channel floating gate MOSFET. The MOSFET 278 is sensitive to any difference between the two input voltages. The gate voltage on the MOSFET 278 controls the flow of current through the device. The output of each averaging unit 276 is selectably connected to the output line 280 by respective transmission gates 282, each of which is controlled by a respective control signal on a control line $Select_o$ (not shown). The outputs from averaging units 276 of successive rows are consecutively coupled to the output line 280.

Like the units 274, the floating gate devices 424 and 426 of the unit 276 are programmable to trim the operation of the unit 276. The trimming operation for the unit 276 is the same as for the units 274 with a further step of programming the operation of the MOSFET 278. During programming, the respective control line $Select_o$ is connected to the respective line 396 to ensure that the correct output device is monitored on the output line 280. The output current from the MOSFET 278 is adjusted by varying the potential on its floating gate so that a pre-determined output current is obtained for zero differential input. The floating gate of the MOSFET 278 is programmed by the application of a high voltage on a programming line p3. Only the floating gate of a selected device is programmed since the floating gates of de-selected devices are at a raised potential by virtue of devices equivalent to the MOSFET 400 coupling the voltage $V_{high}$ to the gates of de-selected output devices. Once the trimming operation is completed, the voltages on the lines 396 are set high to ensure normal operation of the units 274 and 276; the lines 408 are set high to ensure the lines 284 are isolated from the line 412 and the control line Select$_o$ is decoupled from the line 396.

Figure 9:
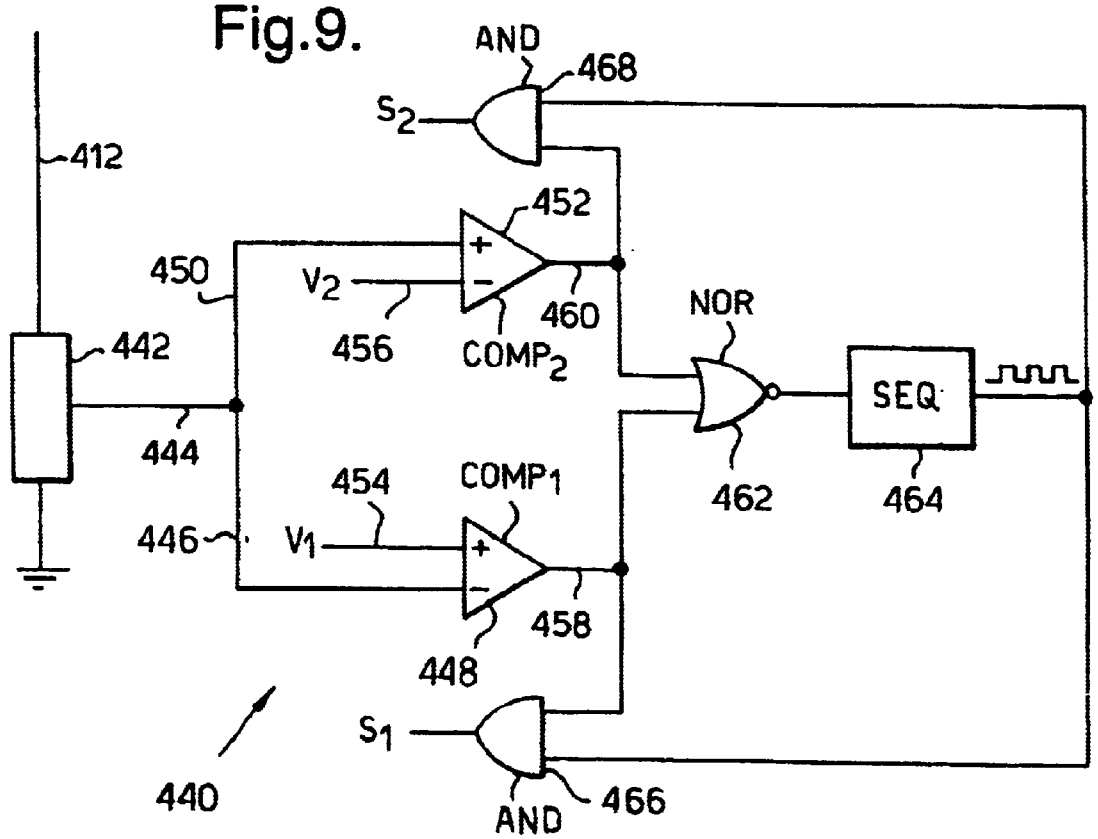
FIG. 9 shows a comparator unit for programming floating gate devices in the FIGS. 8a and 8b averaging units.

Referring now to FIG. 9 there is shown a double comparator arrangement 440 suitable for programming the floating gate MOSFETs 390, 392, 424 and 426 of the averaging units 274 and 276. A current measuring unit 442 measures the current flowing on the line 412 and outputs a signal on a line 444 in response to the measured current. The signal on the line 444 has a value (2.5±δ) volts, where δ is dependent on the magnitude of the current. Thus if the current requires increasing, the signal is less than 2.5 V and if the current requires decreasing, the signal is greater than 2.5 V. The line 444 provides an input 446 to a comparator 448 and an input 450 to a comparator 452. A second input 454 to the comparator 448 carries a voltage $V_1$ and a second input 456 to the comparator 452 carries a voltage $V_2$. $V_1$ is slightly less than 2.5 V, perhaps 2.4 V, and $V_2$ is slightly greater than 2.5 V, perhaps 2.6 V. Altering the values of $V_1$ and $V_2$ affects the precision of the trimming process. The exact values would be determined by routine testing, balancing the speed of the trimming operation against the degree of precision. The differences between 2.5 V and the values of $V_1$ and $V_2$ provide an acceptable range for the current on line 412.

The comparator 448 generates a logical '1' on an output 458 when the signal on the line 444 is less than $V_1$ and a logical '0' when it is greater; similarly the comparator 452 generates a logical '1' on an output 460 when the signal on the line 444 is greater than $V_2$ and a logical '0' when it is less. The outputs 458 and 460 provide the inputs for a NOR gate 462. The NOR gate 462 provides a signal to a pulse generator 464 when the output current on the line 412 is within a desired range and hence the trimming operation for a pair of MOSFETs within an averaging unit is complete.

The pulse generator 464 generates a series of pulses during the trimming operation. These pulses are output to two AND gates 466 and 468. The AND gate 466 carries out a logical AND operation on the pulsed output of the pulse generator 464 and the output of the comparator 448, resulting in a signal $S_1$. The AND gate 468 carries out a logical AND operation on the pulsed output of the pulse generator 464 and the output of the comparator 452, resulting in a signal $S_2$. The signal $S_1$ controls switches (not shown) which switch the low voltage input signals to a high voltage pulse routing circuit (not shown) as shown in FIG. 5 which provides a pulse on the programming line p1 to program MOSFETs 390 or 424 as appropriate. The signal $S_2$ controls switches (not shown) which switch low voltage input signals to a further high voltage routing circuit (not shown) which provides a pulse on the programming line p2 to program MOSFETs 392 or 426 as appropriate. A pulse is thus only sent to a respective one of the pair of floating gate MOSFETs of the averaging units when either of the comparators 448 and 452 generates a logical '1', indicating that further adjustment of the current on the line 412 is required. A pulse cannot be sent to both MOSFETs of an averaging unit simultaneously. The potential of the floating gate of the MOSFETs 390 or 424 are increased if the current in the line 412 requires increasing and the potential of the floating gate of the MOSFETs 392 or 426 are increased if the current in the line 412 requires reducing.

There is a time lapse in successive pulses from the pulse generator 464 which is sufficient for the averaging units and comparators to react after the end of a pulse to produce a new value of the current on the line 412 and new logic signals prior to the next pulse. Once the pulse generator receives a signal from the NOR gate that the trimming of a particular averaging unit is complete, the trimming of the next averaging unit is initiated by a signal sent to a logic unit (not shown) which controls the setting of the lines 396.

Figure 10:
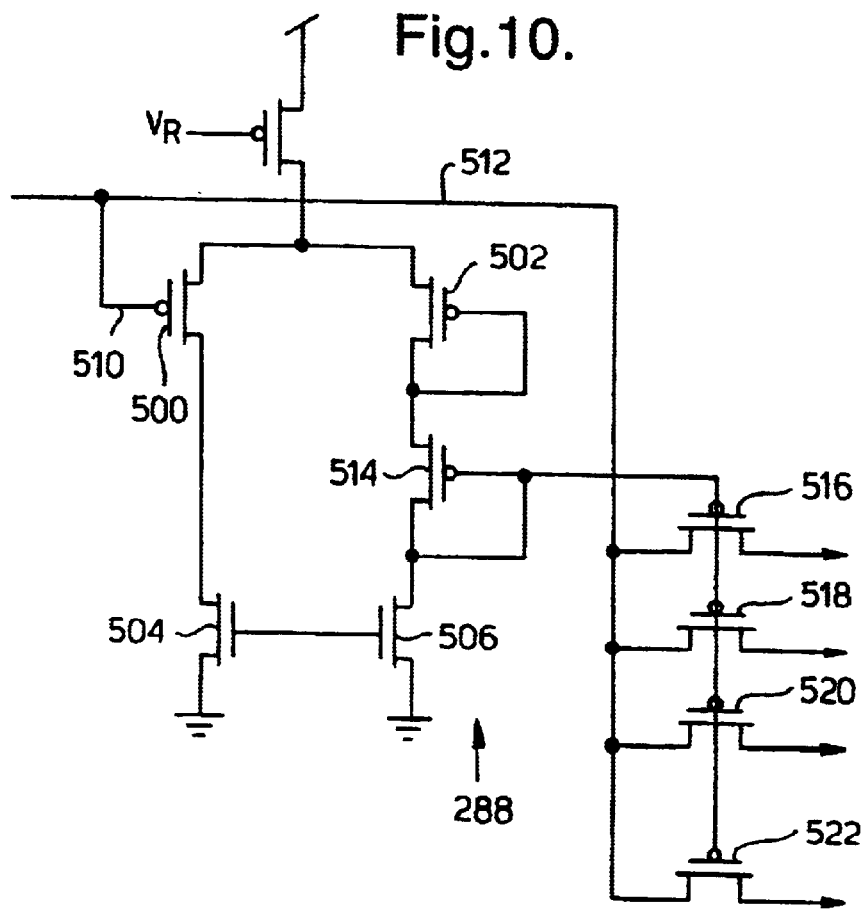
FIG. 10 shows a biasing unit of the FIG. 6 bar-filter unit.
Figure 11:
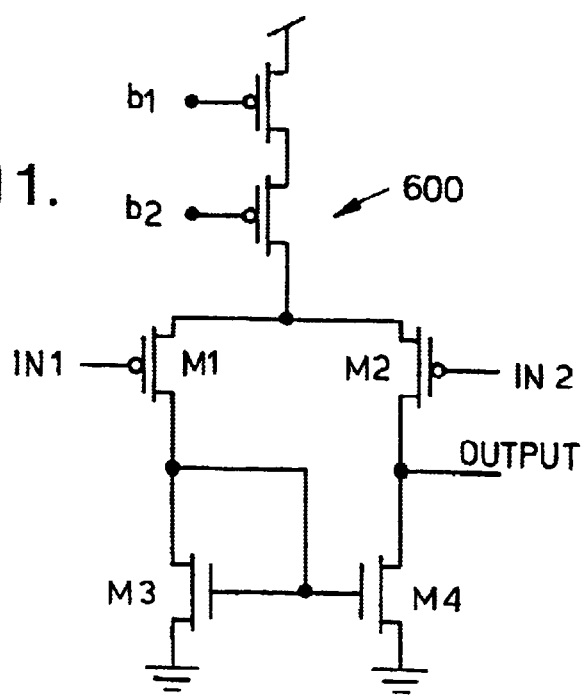
FIG. 11 shows a simple transconductance amplifier.

Referring now also to FIG. 10 there is shown one of the biasing units 288 which is similar to the prior art transconductance amplifier 38 but with the arrangement inverted and the device type changed. The biasing unit 288 comprises a bias circuit 490 and an arrangement of lateral connections 492. The bias circuit 490 comprises two p-channel MOSFETs 500 and 502 and two n-channel MOSFETs 504 and 506.

The drains of the MOSFETs 500 and 502 are connected together and connected to the drain of an n-channel MOSFET 508. The gates of the MOSFETs 504 and 506 are linked together. The gate of the MOSFET 500 is connected by an input line 510 to an output 512 of a transmission gate 286. The MOSFET 502 is diode connected. A further diode connected p-channel MOSFET 514 is positioned between the MOSFETs 502 and 506. The arrangement of lateral connections 492 comprises four p-channel MOSFETs 516 to 522. The gate of the MOSFET 514 is connected to the gates of the four p-channel MOSFETs 516 to 522. One of the source/drain contacts of each MOSFET 516 to 522 is connected to the output 512 and the other source/drain contact of each MOSFET is connected to a respective output to a neighbouring biasing unit.

The conductance of the bias circuit 490 is controlled by in input voltage $V_R$ applied to the gate of the MOSFET 508. When a signal is injected into a laterally connected network, the voltage generated by the input decreases as a function of distance from the input because some of the current injected by the input is shunted to ground. For an array of nodes connected together by a resistance R and with a conductance G to ground at each node, the voltage, $V_n$, at a point n sections away from a source, $V_0$, will be $$V_n = \gamma^n V_0,$$

where $$\gamma = \frac{V^1}{V_0} = 1 + \frac{1}{2L^2} - \frac{1}{L}\sqrt{1 + \frac{1}{4L^2}},$$

where L is a characteristic length, or diffusion length, such that 1/L is equal to $\sqrt{RG}$. The input voltage $V_R$ to the bias circuit 490 controls the conductance to ground of the resistive bias circuit. Changing $V_R$ thus changes the characteristic length L of the filter. Simulation results show that characteristic length of two for a filter with fifteen columns performs well, and a characteristic length of four behaves acceptably.

Returning to FIG. 2, the imaging unit 50 has been described as including an array 54 of 512×512 pixels. The averaging process performed by the bar filter unit 58 is such that a filtered output is not obtainable for pixels in a border region of the array 54. Since the bar filter unit 58 comprises fifteen columns of circuit elements 220 and 222, with the circuit elements 222 forming a central column, data from the first seven columns of the array 54 are passed across the bar filter unit 58 with no output from the central column being measured. Only when the bar filter unit 58 is filled are outputs taken from the central column. Likewise, no output is measured from the last seven columns of the array 54. There will also be pixels from top and bottom of the array 54 which do not contribute to a final image. This is due to edge effects preventing a meaningful local average being obtained for the rows closest to the top and bottom of the array 54. For symmetry reasons, data from the top and bottom seven rows is discarded. After conventional signal processing to convert signals from the imaging unit output 66 of the central column of the bar filter unit 58 into an image for displaying on for example a television screen, a final image of 498×498 pixels is produced.

In order to understand the operation of the averaging units 274 and 276 more fully, the characteristics of a simple transconductance amplifier 600 taking the place of the averaging unit 274 will now be discussed. The amplifier 600 comprises four MOSFETs M1, M2, M3, and M4. The MOSFETs M1 and M2 are p-channel and the MOSFETs M3 and M4 are n-channel. There are two signal inputs to the amplifier 600 In1 and In2 and the amplifier has a current output $I_{out}$. The output current from a transconductance amplifier operating in subthreshold is $I_{out}=I_{tail} \tanh(\kappa \Delta V_{in})$. Within this circuit, $I_0$ variations will cause errors in the differential input voltage, $\Delta V_{in}$ and the size of the output current. The size of the injected current for a particular differential input voltage determines the extent over which the average response is calculated and is therefore equivalent to errors in the biasing units 288, which are considered to be negligible. This source of errors will therefore also be negligible. Simulations suggest that it is the errors $\Delta V_{in}$ which are equivalent to errors in the signal representing the scene, which must be minimised.

If the gate voltages of the two input devices, M1 and M2, are equal there are two mechanisms which could lead to a non-zero output current. A residual source-drain voltage dependence of the current in devices M1 to M4 will lead to a non-zero current even where device variations are excluded. This is common to all circuits and is therefore a systematic error. Variations between devices in the matched pairs M1/M2 and M3/M4 create a random current which varies between individual circuits.

The systematic error can only be minimised during the design of the circuit. Unfortunately, since it depends upon the source-drain voltages within the circuit it changes as the input voltage varies. Thus it is only zero at one particular input voltage. At all other input voltages there will be a finite output current for a zero differential input. This input dependence of the systematic error means that the ideal condition, that zero current is injected into the lateral network in response to a zero differential input, is unattainable. In order to understand the impact of a systematic error consider a number of transconductance amplifiers configured to inject current into a lateral network. If the input voltage to all the circuits is the same and the circuits all have the same error, then symmetry means that all the nodes in the lateral network will be at the same voltage. There will therefore be no lateral current flow and the voltage on each node of the lateral network must be the voltage which results in a zero output current. The differential voltage across each of the transconductance amplifiers will be identical. This suggests that systematic errors, which are common to all circuits, will not introduce output errors which will obscure detail in an image. Thus systematic errors can be tolerated, although they should be minimised whenever possible. Any random errors, which are different in each of the transconductance amplifiers, will introduce errors in the system output which will obscure detail within the scene. These random errors must therefore be minimised in order to increase the system sensitivity. Since random errors arise from variations between individual devices they are usually minimised by increasing the size of the devices to reduces the variation between devices. Unfortunately, the results obtained by Pavasovic, Andreou and Westgate, reported in Journal of VLSI Signal Processing, Volume 8 (1994) page 75, suggest that this will only reliably reduce one component of the variations between devices. An alternative technique for reducing random variations, using floating-gate devices within the circuit, was therefore investigated.

The impact of variations in $I_0$ will now be considered. With zero differential input assume that the current through the device M2 is constant. The output current will be zero if this current is equal to the current through the other input device, M1 after it has been mirrored through the devices M3 and M4. When a current mirror operates in subthreshold $$I_{M4} = \frac{I_{M1} I_{0,M3}}{I_{0,M4}}$$

and hence the output current from the mirror can be adjusted by changing $I_{0,M3}$ or $I^{0,M4}$. Changing the charge on a floating-gate device when the channel is biased to operate subthreshold, is equivalent to varying the $I_0$ parameter. Considering the effect of $I_o$ variations, changing the input devices M1 and M2 to floating gate devices will reduce the channel conductance $g_m$ of these devices and therefore the circuit gain. Therefore, changing the load devices to floating gate devices should be considered. Replacing the MOSFETs M3 and M4 in the current mirror by floating-gate devices will create the flexibility required to ensure that a zero differential input leads to a zero output current. Furthermore, increasing $I_{0,M3}$ will increase $I_{M4}$ whilst increasing $I_{0,M4}$ will decrease $I_{M4}$. Thus, the two floating-gate devices can be used in conjunction with a single polarity high-voltage programming voltage to trim a circuit to remove the random variations.

The ability to trim a circuit with floating-gate devices in the current mirror has been confirmed by simulation. During the simulations, the circuit being trimmed was configured as a buffer so that any errors appear as an offset voltage which can be equated to an error in the input. For the particular circuit simulated the systematic offset with an input of 2 V was found to be 3.7 mV varying to 2.4 mV at an input voltage of 3V. Introducing $I_0$ variations of 10% into the two input devices, by varying the width of these devices, led to offset voltages at 2 V in the range 6.0 mV to 13.7 mV. The simulation results showed that all the circuits could be trimmed to remove this random variation, leaving a population with a tolerable systematic error.

The ability to remove the random variations between circuits, which arise from differences in the value of $I_0$ between devices means that variations in κ must be considered. In order to save area a transconductance amplifier is usually designed with the substrate in which the source-connected input devices are fabricated connected to the appropriate power rail. For these devices with a varying gate-substrate potential, $V_{gb}$, the current voltage characteristic is $$I_{ds}=I_0 \exp(\kappa V_{gb}/U_T)[\exp(-V_{sb}/V_T)-\exp(-V_{db}/V_T)].$$

Since for this layout, $V_{gb}$ will vary with the common-mode input voltage variations in κ, Δκ, will create an effective $I_0$, $I'_0$, where $$I'_0 = I_0 \exp(\Delta \kappa V_{gb}/U_T)$$

which varies with the gate-substrate potential. Since the gate-substrate potential will change with changes to the input, this means that the $I'_0$s of the two input devices will vary differently with changes to the input. In effect the κ variations will create an input-dependent offset voltage which varies between different circuits. This variation means that a population of circuits can only be trimmed to have the same offset at a one particular input. Variations away from this value will create random offset voltages which reduce the accuracy with which the local average is calculated. The problems caused by variations in κ only arise if $V_{gb}$ also varies. These variations will therefore not cause problems in any circuit in which this potential is approximately constant. To a good approximation this situation arises in the current mirrors and in source-coupled devices whose local substrate is connected to the common-source. This suggests that the problems arising from variations in κ can be alleviated if the source-coupled devices are well-connected. Simulations of circuits with this layout show that the systematic offset voltage is independent of the particular combination of κ parameters in the source-coupled and current mirror devices. Thus with this circuit configuration floating-gate devices in the current mirror can remove $I_0$ variations, and the systematic error between circuits induced by κ variations is consistent to a fraction of a millivolt. With floating-gate devices used to trim the averaging units 276, the final stage of trimming the averaging unit is to trim the output MOSFET 278. These devices in each of the circuits must be trimmed to ensure that there is a uniform response to a uniform input scene. However, since the devices can only be programmed to increase the potential on the floating-gate, the target current for the trimming process, i.e. the current which represents a scene with zero contrast, must be set sufficiently high to ensure that the floating-gate potential of all devices must be increased. If this condition is satisfied then a population of output devices can be trimmed to ensure the desired response. Overall, simulation results show that using well-connected input devices and two floating-gate load devices, it will be possible to trim a population of circuits so that they are all almost identical. Furthermore, a floating-gate device can be used to trim the output devices to ensure that there is no subsequent degradation of sensitivity.

Figure 12:
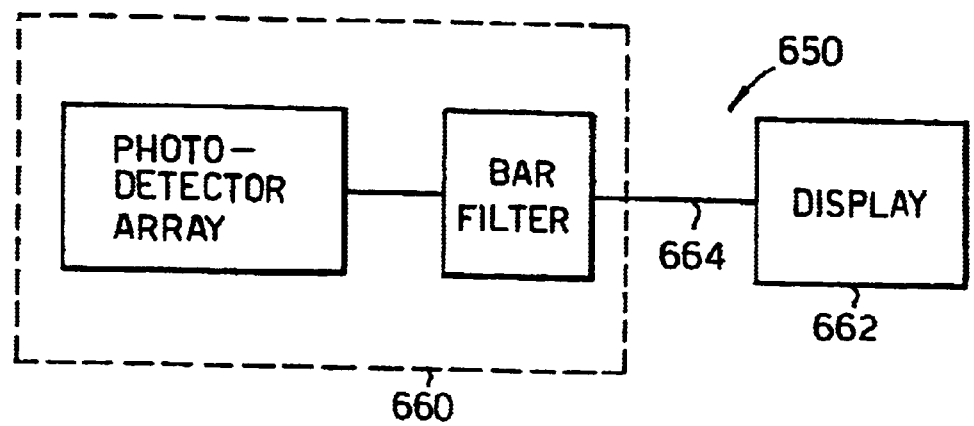
FIG. 12 shows a surveillance system incorporating the FIG. 2 imaging system.

The imaging system 50 of FIG. 2 may be incorporated within a surveillance system. Referring now to FIG. 12, there is shown a surveillance system 650. The system 650 comprises an imaging system 660 and a display system 662. The imaging system 660 is similar to the imaging system 50. Image signals from successive pixels within a column and from successive columns are passed from the imaging system 660 to the display system 662 along a data line 664. The signals from the imaging system 660 control the intensities of display pixels (not shown) within the display system 662 in a manner familiar to those knowledgeable about display technologies.

The surveillance system 650 provides advantages over prior systems in that the degree to which local illumination determines the appearance of an object within a scene is reduced. In a conventional video camera based system, if there are regions of intense brightness within an overall dark scene, then the automatic gain control on the camera will result in objects within the dark background becoming indiscernible. Such a scenario might be at night when the brightness of an approaching car's headlights render all surrounding information indiscernible. Another possible scenario might be a surveillance camera in a city at night where, as a result of locally intense street lighting, objects in shadow are hidden.

The number of bits which describe the pixel intensity may be selected according to the quality of image required. In certain situations, it might be desirable for an image to be represented by one bit per pixel. Whilst for a standard image, the quality deteriorates rapidly as the number of bits is reduced, the image quality of an image generated by the system 660 degrades gracefully as the number of bits is reduced. Even with a one bit per pixel representation, images are recognisable since edges present in a scene are preserved.

The imaging system 50 represents a fully integrated system in which the logarithmic response and the spatial filtering are achieved on a single integrated circuit. Integrating the system 50 on a single integrated circuit provides advantages in terms of compactness and power consumption. Other surveillance systems incorporating means for generating a logarithmic response to incident radiation and subsequent spatial filtering may be constructed.

Figure 13:
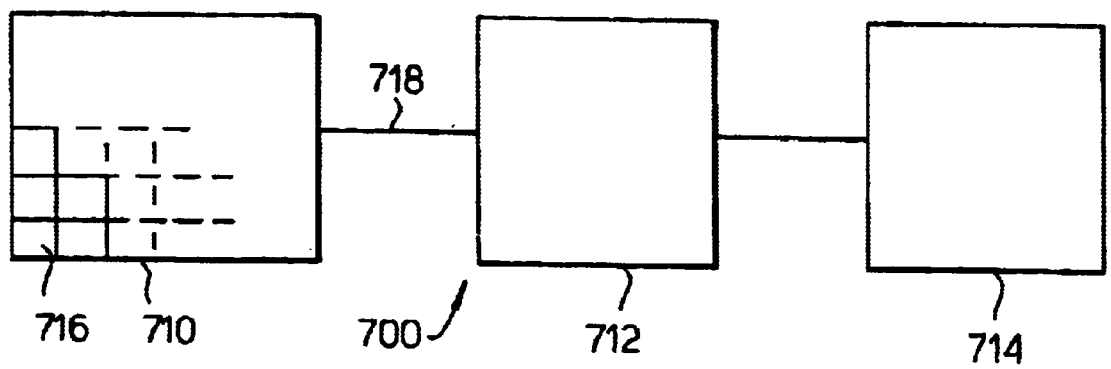
FIG. 13 shows an alternative imaging system of the invention.

Referring to FIG. 13 there is shown an imaging system 700 comprising a detector array 710, a signal digitiser 712 and a digital processor 714. The detector array comprises an array of photodetectors 716. The photodetectors 716 may be photo-transistors or photo-diodes with a select device to allow the current from each pixel within a column to be selectively connected to an output 718 which is common to each row. Connecting the small photo-currents to the relatively large capacitances which arise from using a common row output may limit the speed of operation of the array. This can be avoided by using a buffer which holds the output line at a constant voltage. In order to avoid large changes in the voltages internal to each pixel, any unselected devices can be connected to a second common line which is held at the same voltage. Such a system is described by Mead and Delbrück in Analog Integrated Circuits and Signal Processing, Volume 1 (1991), pages 93 to 106.

The signals from the array 710 are passed to the digitiser 712. In order to be able to detect intensity changes at a level of 1%, the maximum sensitivity of the eye, over an intensity range of three decades, the digitiser 712 would need to be capable of digitising signals from the photodetectors at an accuracy of approximately 17 bits per pixel. This figure of 17 is determined from the expression:

$$\log_2\left(\frac{10^3}{0.01}\right) \approx 17.$$

For a 512×512 pixel array and a frame rate of 50 Hz, the digitisation would have to be performed at a rate of 13 MHz. An analogue to digital converter capable of meeting these requirements would be difficult to design and so the minimum contrast and the intensity range have to be compromised. The digitiser 712 may incorporate analogue to digital converters produced by Analog Devices in their series AD9022/AD9026 which are advertised as being capable of 12-bit conversion at over 20 MHz.

The digitised signals are passed to the processor 714. The processor 714 calculates the logarithm of the digitised signals and performs a high pass filtering operation on the result. The high pass filtering may be achieved in the spatial domain by performing a convolution operation with a suitable kernel familiar to those skilled in image processing. After the filtering operation, the processor 714 sends signals to a display unit 716 which processes the signals from the processor 714 and displays the resulting image. Again, the number of bits representing the final image may be selected according to the clarity of image required and other considerations such as possible image recognition algorithms or data storage and/or transmission requirements.

It is desirable to represent a scene with a given percentage error over the widest possible range of illumination levels. The system 700 with its linear representation suffers from the disadvantage that bright features will be represented too accurately whilst low brightness features will not be represented accurately enough. This disadvantage may be overcome by obtaining an analogue logarithmic representation prior to digitisation.

In such an embodiment, the number of bits required in a digitised signal to represent a 1% change in intensity over an intensity range of three decades is reduced to approximately $I_0$ as determined from the expression:

$$\log_2\left(\frac{\ln(10^3)}{\ln(1.01)}\right) \approx 10.$$

An approach for obtaining a logarithmic representation is to include a logarithmic current-sense amplifier before the output 718. Such an amplifier is described in the previously referenced paper by Mead and Delbrück. The output voltage, $V_{out}$, of such an amplifier is given therein as being determined by the expression $$V_{out} = \frac{V_{ref} + kT/q \ln(I/I_0)}{K},$$

when the current, I, is sub-threshold. Since the logarithm is determined prior to digitisation, there is nor requirement for the processor 714 to calculate a logarithm from the output of the digitiser 712. If the digitised output of the logarithmic signal has 8-bit accuracy, this is equivalent in dynamic range and sensitivity to a 10-bit digitised linear signal. Furthermore, a 10-bit output, capable of dealing with an input dynamic range of more than four orders of magnitude, will have a larger dynamic range than the human eye, and a much wider dynamic range than using 10 bits with a linear system which would only represent a one per cent change in photon flux over one decade change in illumination level.

Individual detectors within the array 710 will be subject to variations in performance and will create a non-uniformn response which may be equivalent to a 10% change in contrast. A non-uniformity correction step will therefore be required after digitisation in order to prevent these variations from obscuring the fine details within a scene. Such a non-uniformity correction step could be performed by the processor 714 prior to the calculation of the logarithmic response by multiplying the digitised signal from each pixel by a scaling factor determined in a calibration routine, or more accurately multiplying the signal by an interpolated correction factor determined using a series of calibration values obtained over a range of illumination levels. Alternatively, the correction could be achieved by subtracting a correction value after the logarithmic response has been calculated.

Figure 14:
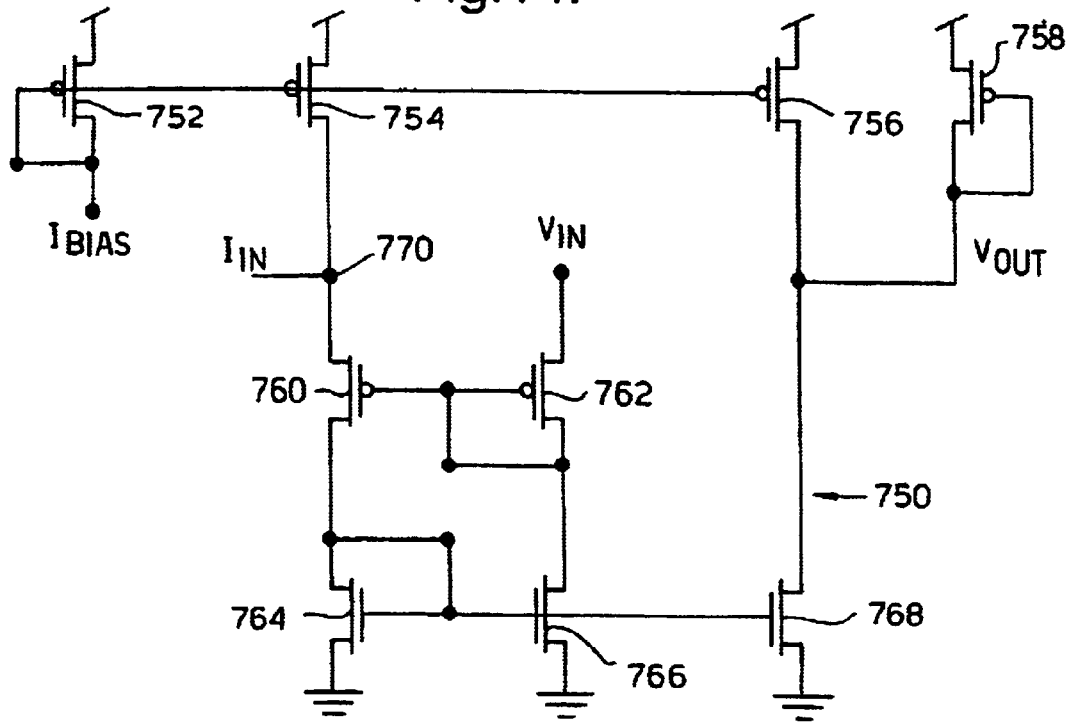
FIG. 14 shows a current mode buffer circuit.

Mead and Delbrück suggest that it would be difficult to operate a large array at the frame rate for low photo-currents of possibly 10 pA, expected at low illumination levels. One of the major problems is the need to prevent "ringing". One approach to overcome this is to employ "smart" sensor concepts which predict the final output from a ringing signal without waiting for the ringing to stop. A further approach is to replace the voltage mode buffer circuit described by Mead and Delbrück with a current mode buffer circuit which holds the output node at a fixed voltage. Without these solutions, the system may be limited to small arrays operating at illumination levels which produce nanoamp photocurrents. FIG. 14 shows a current mode buffer circuit 750 for achieving a solution to this problem.

The circuit 750 comprises six p-channel MOSFETs 752 to 762 and three n-channel MOSFETs 764 to 768. MOSFETs 752, 754, and 756 are matched MOSFETs, as are MOSFETs 764, 766, and 768, and MOSFET pair 760 and 762. The detector array 710 is connected to a node 770, to provide an input current, $I_{in}$. The symmetry of the layout of MOSFETs 760 and 766 mean that the node 770 is held at a constant voltage determined by a voltage source $V_{in}$. The load capacitance for changes in the input current are the capacitances associated with the current mirrors formed by MOSFETs 764, 766, and 768. In order to reduce the response time, a bias current $I_{bias}$ is added to the input current $I_{in}$ from MOSFET 754. This bias current is generated by attaching a current sink to MOSFET 752. This generates a voltage at the node 770 which is distributed to MOSFETs 754 and 756. The summed current $I_{in}+I_{bias}$ is copied into MOSFET 768. MOSFET 756 then supplies current $I_{bias}$ so that the current which flows through MOSFET 758 is $I_{in}$. This current is converted to a voltage which is a logarithmic representation of this current by MOSFET 758 which is diode-connected. In order to increase the speed at which the circuit 750 operates, MOSFETs 756 and 768 may be replaced by several MOSFETs which are the same as MOSFETs 752 and 764 respectively. If n MOSFETs are used in parallel in these positions, then the circuit will operate n-times faster.

In an alternative system, a current-voltage conversion may be performed within the pixel, followed by a buffer circuit such as a source-follower. The current to voltage conversion should create a voltage which is proportional to the logarithm of the photo-current in order to avoid the previously discussed problems of a linear representation. Such a conversion may be achieved using diode connected load MOSFETs operating in the sub-threshold regime. The photodetectors 716 of the array 710 may be replaced by logarithmic photodetector circuits such as the receptor unit 20 of FIG. 1. Whilst non-uniformity corrections to the outputs of the logarithmic photodetector circuits could be performed after digitisation, the result of performing non-uniformity correction digitally would be to produce a corrected output which would be accurate to one less bit than the uncorrected input. This may be avoided by implementing non-uniformity correction within the detector array. Such a system would include an array of photodetectors similar to the array 54 of the imaging unit 50 of FIG. 2. Instead of the output being passed to an analogue filter unit, the output of the array could be digitised and the resulting digital signals filtered in the spatial domain using a convolution process. In cost-sensitive markets, the digitiser accuracy is often reduced to a minimum in order to cut costs. On-chip non-uniformity correction would give a factor of 2 more dynamic range for a given digitiser accuracy.

The filtering operation in the spatial domain may be filter operation using a δ-Gaussian filter. Digitally, this would be implemented using a convolution kernel $$K_{i,j} = A\delta_{i,j} - B\exp(-(i^2 + j^2)/2\sigma^2)$$
$$= A\delta_{i,j} - B\exp(-i^2/2\sigma^2)\exp(-j^2/2\sigma^2),$$

where σ is the width of the filter and A and B are normalisation factors, defined so that $$\sum_{i,j} K_{i,j} = 0.$$

This normalisation gives the maximum reduction in dynamic range, resulting in an image dependent only on the local contrast. In order to eliminate only the very low spatial frequencies from the image, values of σ of about 2 or more are required. If σ=2 then a kernel of dimensions approximately 15×15 is needed to represent the Gaussian sufficiently accurately, with larger values of σ requiring even larger kernels.

Figure 15:
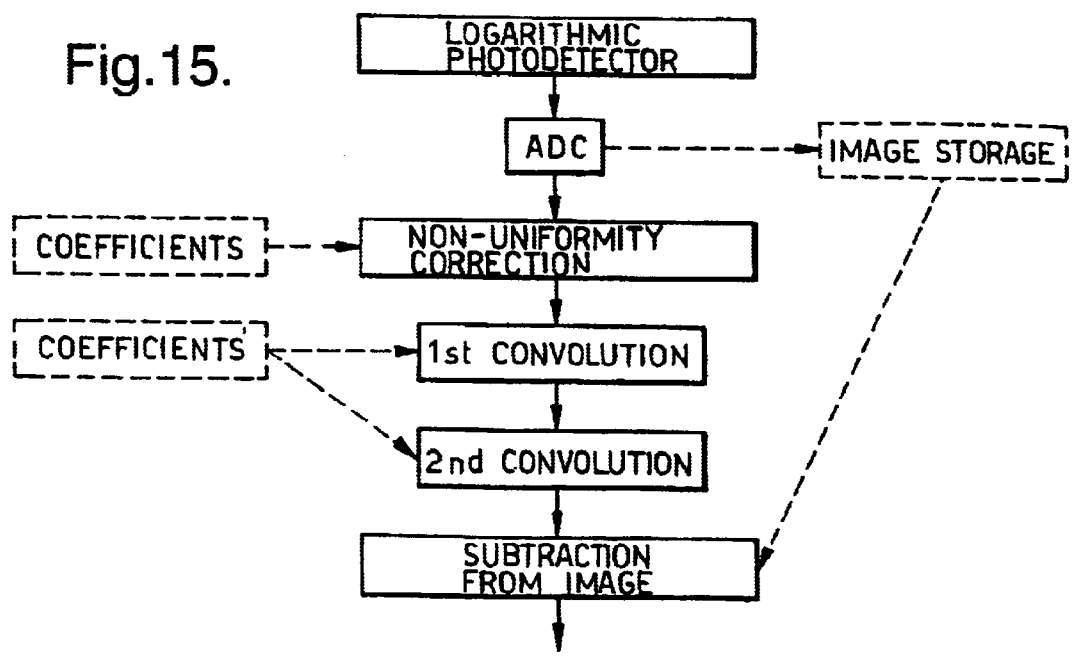
FIG. 15 shows a plan of a convolution filter architecture.

A general kernel operating on a 512×512 image at 50 Hz would require a digital processor capable of approximately $512^2 \times 15^2 \times 50$, or $3 \times 10^9$, multiplication and addition operations per second. However, the separability of the Gaussian kernel into horizontal and vertical parts means that the 15×15 kernel can be replaced by two 15×1 kernels, requiring only $512^2 \times 2 \times 15 \times 50$, or $4 \times 10^8$, multiplication and addition operations per second. After application of the two convolutions, the resulting image must be subtracted from the original logarithmic image suitably normalised. Using the 1-dimensional filters is nearly an order of magnitude less computationally expensive than using a 2-dimensional filter. This results in a reduction in the required system performance, and so leads to a simpler architecture. A plan of the convolution filter architecture for a 1-dimensional filter is shown in FIG. 15.

Analogue spatial filtering of a corrected logarithmic detector output may be achieved using an averaging unit similar to the lateral averaging unit 22 of the FIG. 1 system. This would consume less power than the digital alternatives and may be cheaper for manufacture in large numbers.

The fully integrated system 660 would be the most compact and reliable system and may consume less power, important for battery operated systems.

Imaging systems such as those described above which incorporate a logarithmic representation of a scene which has undergone a high-pass filter operation would be suitable for use in surveillance systems. Such systems would be particularly useful for imaging natural scenes where there is a wide variation in illumination levels, such as regions in shadow and regions in bright sunlight.

Figure 16A:
FIG. 16 shows a village scene with and without filtering.
Figure 16B:
Figure 17A:
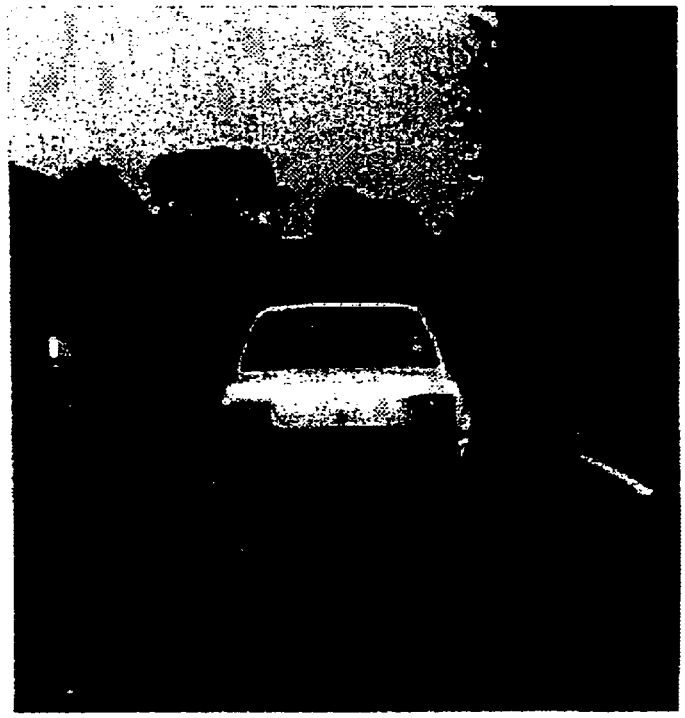
FIG. 17 shows a road scene with and without filtering.
Figure 17B:
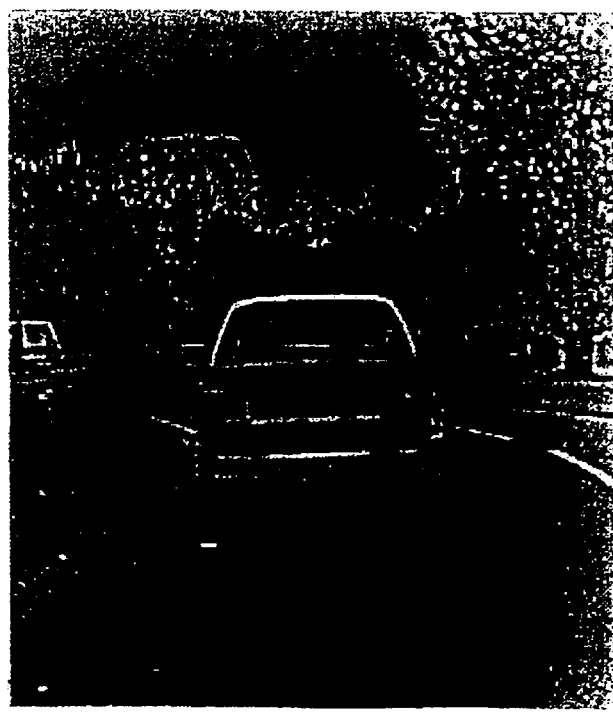

Logarithmic detectors and high-pass spatial filters may be combined to produce a contrast encoded, edge-enhanced representation of a visual scene. Referring to FIG. 16 there is shown a simulation of a representation of a village scene before and after filtering. FIG. 16a shows an image which would have been obtained with a conventional imaging system, for example a video camera. FIG. 16b shows the same image after logarithmic conversion and spatial filtering. FIG. 17 shows a representation of a road scene before and after filtering. FIG. 17a shows an image which would have been obtained from a conventional imaging system and FIG. 17b shows the same image after logarithmic conversion and spatial filtering. FIGS. 16b and 17b were obtained from a linear detector and were subjected to digital processing in a manner similar to that described with reference to the system 700 of FIG. 13, with a difference being that the images were captured using a CCD camera. The edge around the filtered image in FIG. 16b arises because the convolution operation results in an image which is smaller than the input. The filter operation used to produce the filtered images shown in FIGS. 16b and 17b had a $\sigma_n$ value of two.

Figure 18A:
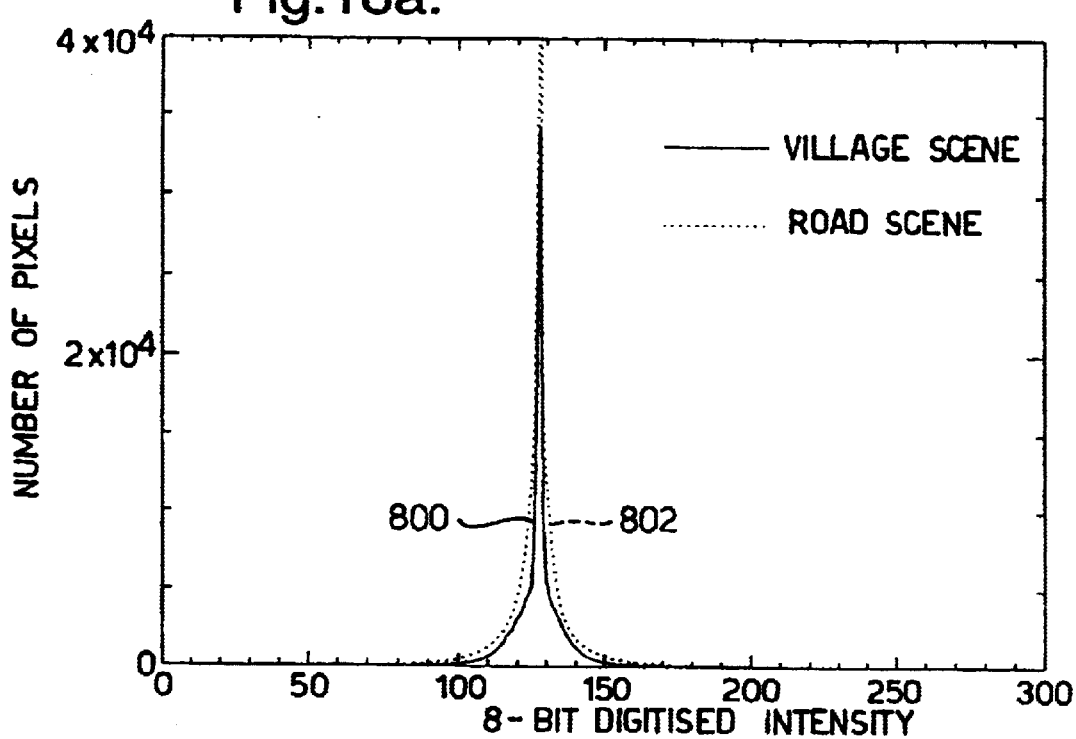
FIG. 18 illustrates pixel intensity distributions with and without filtering.
Figure 18B:
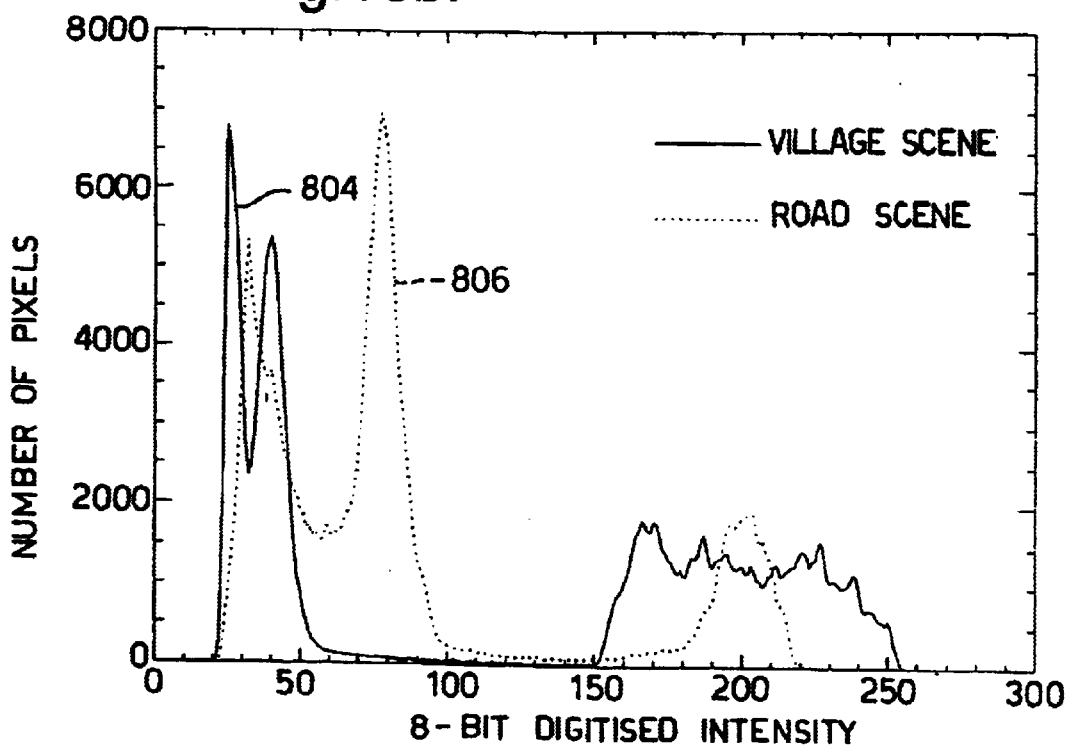

FIG. 18 shows in graphical form the distribution of the pixel intensity values of the FIG. 16 and FIG. 17 images. FIG. 18a shows the distribution of intensity values in the filtered outputs. A solid line 800 is a plot of the pixel intensity distribution from FIG. 16b and a solid line 802 is a plot of the pixel intensity distribution from FIG. 17b. FIG. 18b, shows the distribution of intensity values in the filtered outputs. A solid line 804 is a plot of the pixel intensity distribution from FIG. 16a and a solid line 806 is a plot of the pixel intensity distribution from FIG. 17a. Comparing FIG. 18a with FIG. 18b, the distributions in intensities in FIG. 18a is considerably narrower than those in FIG. 18b. The distribution intensities in FIG. 18a show a uni-modal distribution centred around a particular intensity. Since the distributions in FIG. 18a are narrower than those in FIG. 18b, it follows that the image can be represented in fewer bits. Analysis of FIG. 18a indicates that FIGS. 16b and 17b could be represented using as few as five bits per pixel.

Figure 19A:
FIG. 19 shows three bits per pixel representations of the FIG. 17 images.
Figure 19B:
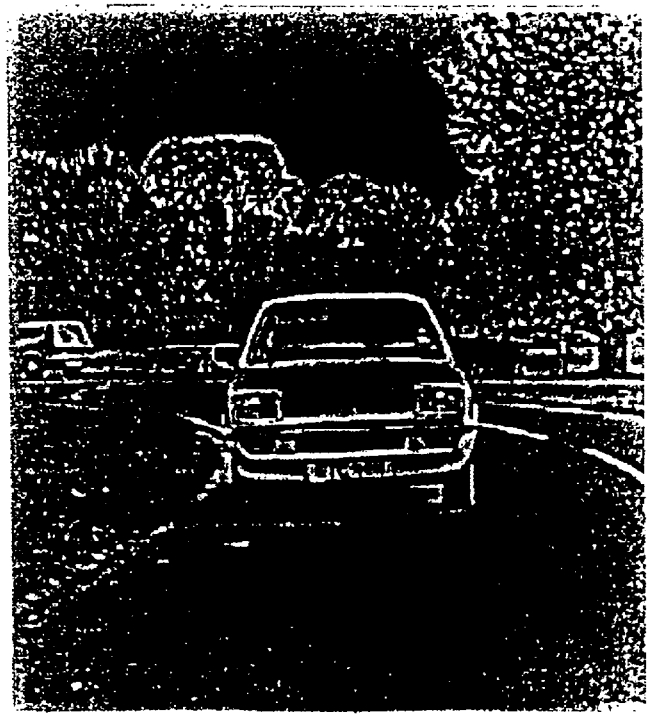
Figure 20:
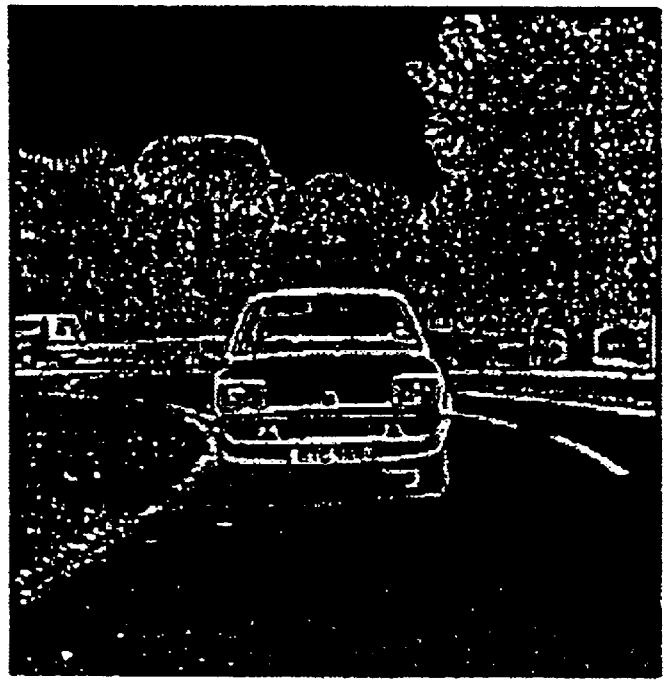
FIG. 20 shows a single bit per pixel representation of a FIG. 17 image.

As a comparison, FIG. 19 shows the images of FIG. 16 digitised so as to be represented by three bits per pixel. FIG. 19a represents a digitisation of FIG. 16a and FIG. 19b represents a filtered output. FIG. 20 is a representation of the FIG. 16 image in which, after a threshold has been imposed, the image is represented by a single bit per pixel. Such a representation still contains recognisable detail and may be a suitable format for image recognition algorithms to operate on, as well as reducing the amount of data which a data storage system would have to store.

Figure 21:
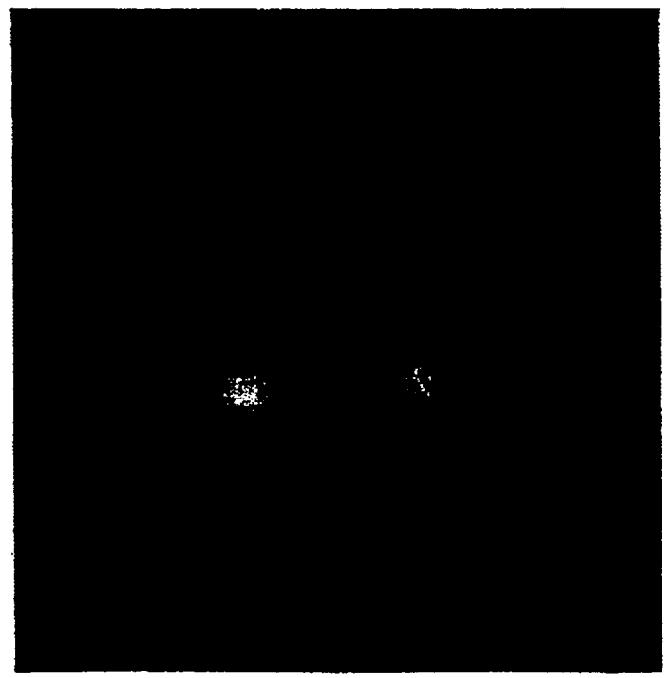
FIG. 21 shows a simulated night-time road scene.
Figure 22:
FIG. 22 shows the FIG. 21 image after logarithmic conversion and spatial filtering.
Figure 23:
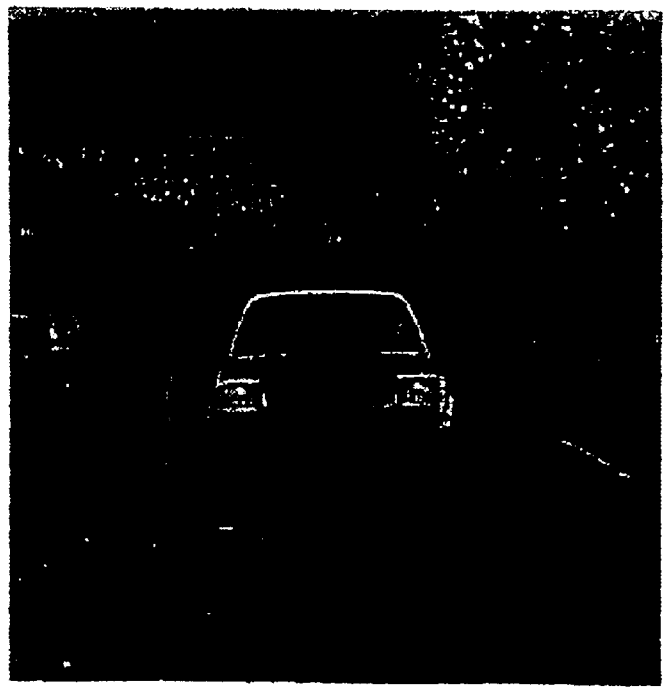
FIG. 23 shows the FIG. 21 image processed to reduce the effect of dazzle.

The imaging systems described above may be incorporated into surveillance systems for use in observing natural scenes. There is a requirement for an imaging system which is capable of imaging objects at night even in the presence of intense light sources in the image. An example of an application for such a system is for night-time surveillance of motor traffic. FIG. 21 is a simulation of the response of a conventional imaging system when imaging a car at night. As can be seen from FIG. 21, the effect of the car's headlights is to cause the obliteration of most of the detail of the car. FIG. 22 is a simulation of the same image which would be produced by an imaging system comprising a logarithmic detector and a spatial filter. Whilst the dazzle effect of the car's headlights has been reduced, the resulting image of the car is faint due to a large number of photons being scattered from the headlights. FIG. 23 is a simulation of the same image in which a linear current-mode detector is used to capture the image and after digital processing to filter the image spatially. In the spatial filter, a local estimate of the additional photons from the headlights is subtracted from the response of each pixel. A system for obtaining the image of FIG. 23 would comprise a high-dynamic range detector array together with a high dynamic range digitiser and a digital processor; in other words, similar to the system 700 without the logarithmic conversion. Whilst FIGS. 21 to 23 are simulations of night-time scenes, it may be seen that such a system would be capable of identifying important features, such as a car's registration identity, without being dazzled.

A further possible application for imaging systems comprising a logarithmic response photodetector and filtering means is in an electronic photographic system. Currently available electronic cameras rely on a combination of limited resolution, limited picture storage capability and image compression techniques to achieve a realistic performance. An electronic photographic system which generated a logarithmic representation of an image and filtered the image would have a lower data storage requirement, which would be of benefit in increasing the number of pictures which could be stored, or the resolution, or both. Prior to the display of images stored by such a system, the logarithmic representation of the image could be converted back to a linear representation for either displaying on a screen or for printing using a standard printer. For use as a portable camera, power consumption would be of critical importance and so the system 50 might be the most suitable for incorporation into such a camera.

What is claimed is:

1. A method of correcting for device variations in an imaging system, said system incorporating:
   (i) detecting means (52) comprising multiple detector elements (56) arranged to detect electromagnetic radiation from a scene and to generate pixel image signals in response thereto;
   (ii) processing means (58) arranged to high-pass spatially filter the pixel image signals and to generate processed output image signals having a dynamic range which is less than that of radiation from the imaged scene, the processing means being spatially separate from the detecting means (52); and
   (iii) floating gate device compensating means (118, 278) for compensating for errors arising from variation in the characteristics of circuit elements incorporated into the detecting means (52);
   the method comprising the steps of
   (a) resetting the floating gate device compensation means by exposing it to ultra violet radiation to remove charge stored therein;
   (b) exposing the detector elements to a uniform intensity of radiation from a scene;
   (c) selecting an element and comparing its pixel image signal with a respective desired output signal;
   (d) injecting charge into the floating gate device means to adjust its characteristics so that the pixel image signal is substantially equal to the desired output signal;
   (e) repeating steps (c) and (d) until all elements in the system have been corrected.

2. A method according to claim 1 wherein, in step (d), pulsed charge injection into the floating gate device means is employed.

3. A method according to claim 1 wherein the floating gate device means comprises a floating gate MOSFET associated with each element.

4. A method according to claim 1 wherein, in step (a), the floating gate device means is exposed to ultra violet radiation through a mask configured to transmit ultra violet radiation selectively to the floating gate device means and the detector elements only.

5. A method of correcting for device variations in an imaging system, said system incorporating:
   (i) detecting means (52) comprising multiple detector elements (56) arranged to detect electromagnetic radiation from a scene and to generate pixel image signals in response thereto;
   (ii) processing means (58) arranged to high-pass spatially filter the pixel image signals and for generating processed output image signals having a dynamic range which is less than that of radiation from the imaged scene, said processing means spatially separate from the detecting means (52); and
   (iii) floating gate device compensating means (118, 278) for compensating for errors arising from variation in the characteristics of circuit elements incorporated into the processing means (220);
   the method comprising the steps of
   (a) resetting the floating gate device compensation means by exposing it to ultra violet radiation to remove charge stored therein;
   (b) exposing the detector elements to a uniform intensity of radiation;
   (c) selecting an element and comparing its output image signal with a respective desired output signal;
   (d) injecting charge into the floating gate device means to adjust its characteristics so that the output image signal is substantially equal to the desired output signal;
   (e) eating steps (c) and (d) until the processing means is corrected for all elements in the system.

6. A method according to claim 5 wherein, in step (d), pulsed charge injection into the floating gate device means is employed.

7. A method according to claim 5 wherein the floating gate device means comprises a floating gate MOSFET associated with each element.

8. A method according to claim 7 wherein, in step (a), the floating gate device means is exposed to ultra violet radiation through a mask configured to transmit ultra violet radiation selectively to the floating gate device means and the detector elements only.

9. An imaging system incorporating:
   an array of pixel circuits having respective detector elements and arranged to generate pixel signals providing a logarithmic response to incident radiation,
   a processing apparatus for spatially filtering the pixel signals to provide processed signals with reduced dynamic range compared to that of radiation intensity from an imaged scene, wherein each pixel circuit incorporates a respective buffer circuit to buffer the respective detector element with respect to an array output, and the buffer circuit includes a transistor which is programmable to counteract variation between pixel circuit characteristics.

10. A system according to claim 9 wherein the buffer circuit is a source follower circuit and the processing apparatus is arranged to provide high pass spatial filtering of signals from the pixel circuits to attenuate contrast in an imaged scene arising from variation in illumination level relative to that from variation in scene reflection coefficient.

11. A system according to claim 10 wherein the transistor is a MOSFET having a floating gate and is programmable by storage of charge on the floating gate.

12. A system according to claim 10 arranged to provide a digitised filtered image comprising pixel image signals of not more than 5 bits.

13. A system according to claim 12 arranged to provide single bit pixel image signals.

14. A system according to claim 10 wherein the processing apparatus incorporates an array of averaging circuits each arranged to subtract a local average of pixel circuit signals from an input pixel circuit signal and to update this average in response to any difference between it and the latter.

15. A system according to claim 14 wherein:
   the array of pixel circuits and the processing apparatus are both connected in rows and columns, and
   the processing apparatus has the same number of rows as the array of pixel circuits and a number of columns equal to the number of pixel circuits in any row over which a local average signal is derived.

16. A system according to claim 14 wherein the averaging circuits are amplifiers incorporating MOSFETs with floating gates which are chargeable to trim amplifier outputs and counteract variations therebetween.

17. A system according to claim 14 wherein the averaging circuits are each connected to nearest neighbour averaging circuits.

18. A system according to claim 10 wherein the processing apparatus implements spatial filtering by means of a convolution kernel separated into horizontal and vertical parts.

19. A system according to claim 18 wherein the processing apparatus is arranged to process resulting image data and original normalised logarithmic image data by subtraction of one from the other after application of the convolution kernel.

20. A system according to claim 19 wherein the processing apparatus implements spatial filtering by means of a Gaussian convolution kernel.

21. A system according to claim 10 wherein the processing apparatus implements spatial filtering by means of a δ-Gaussian filter having a convolution kernel given by:

$$K_{i,j} = A\delta_{i,j} - Be^{\left(\frac{(-i^2+j^2)}{2\sigma^2}\right)}$$

where σ is a filter width, A and B are normalisation constants and i and j are indices indicating pixel position in the array.

22. A system according to claim 10 wherein the processing apparatus is arranged to provide high pass spatial filtering by:

associating pixel circuits into groups, each group corresponding to a respective localised region of an imaged scene, for each group determining an average pixel value corresponding to average illumination intensity in the respective localised region of an imaged scene, and for each pixel circuit determining a difference between its pixel value and the average pixel value for its group.

23. A system according to claim 9 wherein the transistor is a MOSFET having a floating gate and is programmable by storage of charge on the floating gate.

24. A system according to claim 23 wherein the transistor is arranged to act as a programmable current source for a MOSFET source follower transistor in the buffer circuit.

25. A system according to claim 24 wherein the buffer circuit is connected to an output in a circuit region between the floating gate MOSFET transistor and the MOSFET source follower transistor.

26. A system according to claim 24 wherein the buffer circuit includes a pass transistor for controlling whether or not an output signal is available from the associated pixel circuit.

27. A method of producing an image incorporating the steps of:

providing an array of pixel circuits with respective detector elements, each pixel circuit having a buffer circuit to buffer the respective detector element with respect to an array output, and the buffer circuits including respective transistors which are programmable to alter pixel circuit characteristics, programming the transistors to counteract variation between pixel circuit characteristics, from detector element signals generating signals providing logarithmic response to incident radiation, and spatially filtering the logarithmic signals to provide processed signals with reduced dynamic range compared to that of radiation intensity in an imaged scene.

28. A method according to claim 27 wherein the step of spatially filtering the logarithmic signals comprises high pass spatial filtering to attenuate contrast in an imaged scene arising from variation in illumination level relative to that from variation in scene reflection coefficient, wherein the buffer circuit is a source follower circuit.

29. A method according to claim 28 wherein each transistor is a MOSFET having a floating gate and in that the programming step comprises storing charge on floating gates.

30. A method according to claim 29 including the step of operating the floating gate MOSFET transistor as a programmable current source for a source follower transistor in the buffer circuit.

31. A method according to claim 30 including outputting from the buffer circuit via an output in a region of this circuit which connects the floating gate MOSFET transistor to the MOSFET source follower transistor.

32. A method according to claim 31 wherein the buffer circuit includes a pass transistor arranged control whether or not an output signal is available from the associated pixel circuit, and the method includes the step of changing a voltage applied to the pass transistor to obtain an output from the pixel circuit.

33. A method according to claim 28 including the step of local averaging using amplifiers incorporating MOSFETs with floating gates, and the step of charging the floating gates to trim amplifier outputs and counteract variations therebetween.

34. A method according to claim 28 wherein the step of spatially filtering the logarithmic signals comprises:

associating pixel circuits into groups, each group corresponding to a respective localised region of an imaged scene, for each group determining an average pixel value corresponding to average illumination intensity in the respective localised region of the imaged scene, and for each pixel circuit determining a difference between its pixel value and the average pixel value for its group.

35. A method according to claim 27 including forming a digitised filtered image comprising pixel image signals represented by not more than 5 bits.

36. A method according to claim 35 wherein the pixel image signals are represented by a single bit in the filtered image signal.

37. A method according to claim 27 wherein spatial filtering is implemented by means of a convolution kernel separated into horizontal and vertical parts.

38. A method according to claim 37 wherein after application of the horizontal and vertical parts of the convolution kernel, resulting image data is subtracted from original normalised logarithmic image data.

39. A method according to claim 37 wherein spatial filtering is implemented by means of a Gaussian convolution kernel.

40. A method according to claim 27 wherein spatial filtering is implemented by means of a δ-Gaussian filter having a convolution kernel given by:

$$K_{i,j} = A\delta_{i,j} - Be^{\left(\frac{(-i^2+j^2)}{2\sigma^2}\right)}$$

where is a filter width, A and B are normalisation constants and i and j are indices indicating pixel position in the array.

* * * * *